(12) United States Patent
Choi

(10) Patent No.: US 11,676,913 B2
(45) Date of Patent: Jun. 13, 2023

(54) SEMICONDUCTOR PACKAGE

(71) Applicant: SAMSUNG ELECTRONICS CO., LTD., Suwon-si (KR)

(72) Inventor: Eun-Kyoung Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 94 days.

(21) Appl. No.: 17/134,978

(22) Filed: Dec. 28, 2020

(65) Prior Publication Data
US 2021/0358866 A1    Nov. 18, 2021

(30) Foreign Application Priority Data

May 12, 2020 (KR) .................. 10-2020-0056259

(51) Int. Cl.
*H01L 23/00* (2006.01)
*H01L 25/18* (2023.01)
(Continued)

(52) U.S. Cl.
CPC ........ *H01L 23/562* (2013.01); *H01L 21/4853* (2013.01); *H01L 21/563* (2013.01); *H01L 23/3185* (2013.01); *H01L 23/3675* (2013.01); *H01L 23/49838* (2013.01); *H01L 24/16* (2013.01); *H01L 25/0655* (2013.01); *H01L 25/18* (2013.01); *H01L 25/50* (2013.01); *H01L 2224/16157* (2013.01); *H01L 2924/1431* (2013.01); *H01L 2924/1434* (2013.01); *H01L 2924/18161* (2013.01); *H01L 2924/3512* (2013.01)

(58) Field of Classification Search
CPC ............... H01L 25/0655; H01L 23/562; H01L 23/3675; H01L 23/3185; H01L 23/49838; H01L 25/50; H01L 2224/16157; H01L 2224/16145; H01L 2924/1434; H01L 2924/18161; H01L 24/16; H01L 25/18; H01L 2924/3512
See application file for complete search history.

(56) References Cited

U.S. PATENT DOCUMENTS 5,119,171 A   6/1992 Lesk et al.
7,033,859 B2  4/2006 Pendse
(Continued)

FOREIGN PATENT DOCUMENTS

JP   09181211    7/1997
JP   2001-160659 6/2001
(Continued)

*Primary Examiner* — Thanh Y. Tran
(74) *Attorney, Agent, or Firm* — F. Chau & Associates, LLC

(57) ABSTRACT

A semiconductor package includes a substrate. A first semiconductor chip is disposed on the substrate and is electrically connected to the substrate. The first semiconductor chip comprises a first sidewall extending in a first direction, a second sidewall extending in a second direction that crosses the first direction, and a third sidewall disposed between the first sidewall and the second sidewall and configured to connect the first sidewall and the second sidewall. The third sidewall has a curved surface shape. A second semiconductor chip is disposed on the first semiconductor chip and is electrically connected to the first semiconductor chip.

20 Claims, 23 Drawing Sheets

(51) Int. Cl.
*H01L 23/31* (2006.01)
*H01L 23/367* (2006.01)
*H01L 23/498* (2006.01)
*H01L 21/48* (2006.01)
*H01L 21/56* (2006.01)
*H01L 25/00* (2006.01)
*H01L 25/065* (2023.01)

(56) References Cited

U.S. PATENT DOCUMENTS

| | | |
|---|---|---|
| 9,159,665 B2 | 10/2015 | Pendse |
| 2007/0018335 A1 | 1/2007 | Cho et al. |
| 2010/0019354 A1 | 1/2010 | Farooq et al. |
| 2014/0134804 A1* | 5/2014 | Kelly ................... H01L 25/0657 438/118 |
| 2018/0358280 A1* | 12/2018 | Gandhi .................... H01L 24/73 |
| 2019/0148256 A1* | 5/2019 | Jung ........................ H01L 24/97 257/712 |
| 2019/0273111 A1 | 9/2019 | Skeete |
| 2019/0312019 A1* | 10/2019 | Pietambaram ...... H01L 23/5381 |
| 2020/0211969 A1* | 7/2020 | Hossain ............... H01L 25/0657 |
| 2020/0411443 A1* | 12/2020 | Guo ........................ H01L 24/09 |
| 2021/0066254 A1* | 3/2021 | Yu ........................ H01L 23/5385 |
| 2022/0130738 A1* | 4/2022 | Cobb ..................... H05K 1/189 |

FOREIGN PATENT DOCUMENTS

| | | |
|---|---|---|
| JP | 3592515 | 11/2004 |
| JP | 2008-198905 | 8/2008 |

\* cited by examiner

SEMICONDUCTOR PACKAGE

CROSS-REFERENCE TO RELATED APPLICATION

This application claims priority under 35 U.S.C. § 119 to Korean Patent Application No. 10-2020-0056259, filed on May 12, 2020 in the Korean Intellectual Property Office, the disclosure of which is incorporated by reference in its entirety herein.

TECHNICAL FIELD

The present inventive concepts relate to a semiconductor package.

DISCUSSION OF RELATED ART

In recent trends within the electronic industry, the size of semiconductor chips and semiconductor packages have increased to provide increased performance. However, the thickness of the semiconductor packages is decreasing, for incorporation of the semiconductor packages into relatively thin electronic devices.

Semiconductor packages are being developed to provide multi-functionality, higher capacity and smaller size. Therefore, by integrating a plurality of semiconductor chips into a single semiconductor package, a high capacity and multi-functionality may be achieved while significantly reducing the size of the semiconductor package.

SUMMARY

Aspects of the present inventive concepts provide a semiconductor package with increased reliability, by forming at least a partial portion of a sidewall of an interposer into a curved surface that prevents a crack from being generated in a lower portion of the interposer.

Aspects of the present inventive concepts also provide a semiconductor package with increased reliability, by forming at least a partial portion of a sidewall of a semiconductor chip into a curved surface that prevents a crack from being generated in a lower portion of the semiconductor chip.

According to an exemplary embodiment of the present inventive concepts, a semiconductor package includes a substrate. A first semiconductor chip is disposed on the substrate and is electrically connected to the substrate. The first semiconductor chip includes a first sidewall extending in a first direction, a second sidewall extending in a second direction that crosses the first direction, and a third sidewall disposed between the first sidewall and the second sidewall and configured to connect the first sidewall and the second sidewall. The third sidewall has a curved surface shape. A second semiconductor chip is disposed on the first semiconductor chip and is electrically connected to the first semiconductor chip.

According to an exemplary embodiment of the present inventive concepts, a semiconductor package includes a substrate. An interposer is disposed on the substrate and is electrically connected to the substrate. The interposer includes a first sidewall extending in a first direction, a second sidewall extending in a second direction that crosses the first direction, and a third sidewall disposed between the first sidewall and the second sidewall and configured to connect the first sidewall and the second sidewall. The third sidewall has a curved surface shape. A first semiconductor chip is disposed on the interposer. A second semiconductor chip is disposed on the interposer. The second semiconductor chip is spaced apart from the first semiconductor chip. The interposer is configured to electrically connect the second semiconductor chip to the first semiconductor chip.

According to an exemplary embodiment of the present inventive concepts, a semiconductor package includes a substrate. An interposer is disposed on the substrate and is electrically connected to the substrate. The interposer includes silicon. The interposer includes a first sidewall extending in a first direction, a second sidewall extending in a second direction that crosses the first direction, and a third sidewall disposed between the first sidewall and the second sidewall and configured to connect the first sidewall and the second sidewall. The third sidewall has a curved surface shape. A memory package is disposed on the interposer. A logic semiconductor chip is disposed on the interposer and is spaced apart from the memory package. The interposer is configured to electrically connect the logic semiconductor chip to the memory package. A heat sink is disposed on the substrate and covers the interposer, the memory package, and the logic semiconductor chip.

However, aspects of the present inventive concepts are not restricted to those set forth herein. The above and other aspects of the present inventive concepts will become more apparent to one of ordinary skill in the art to which the present inventive concepts pertain by referencing the detailed description of exemplary embodiments given below.

BRIEF DESCRIPTION OF THE DRAWINGS

The above and other aspects and features of the present inventive concepts will become more apparent by describing in detail exemplary embodiments thereof with reference to the attached drawings, in which.

DETAILED DESCRIPTION OF EXEMPLARY EMBODIMENTS

Hereinafter, a semiconductor package according to some exemplary embodiments of the present inventive concepts will be described with reference to FIGS. 1 to 4.

Figure 1:
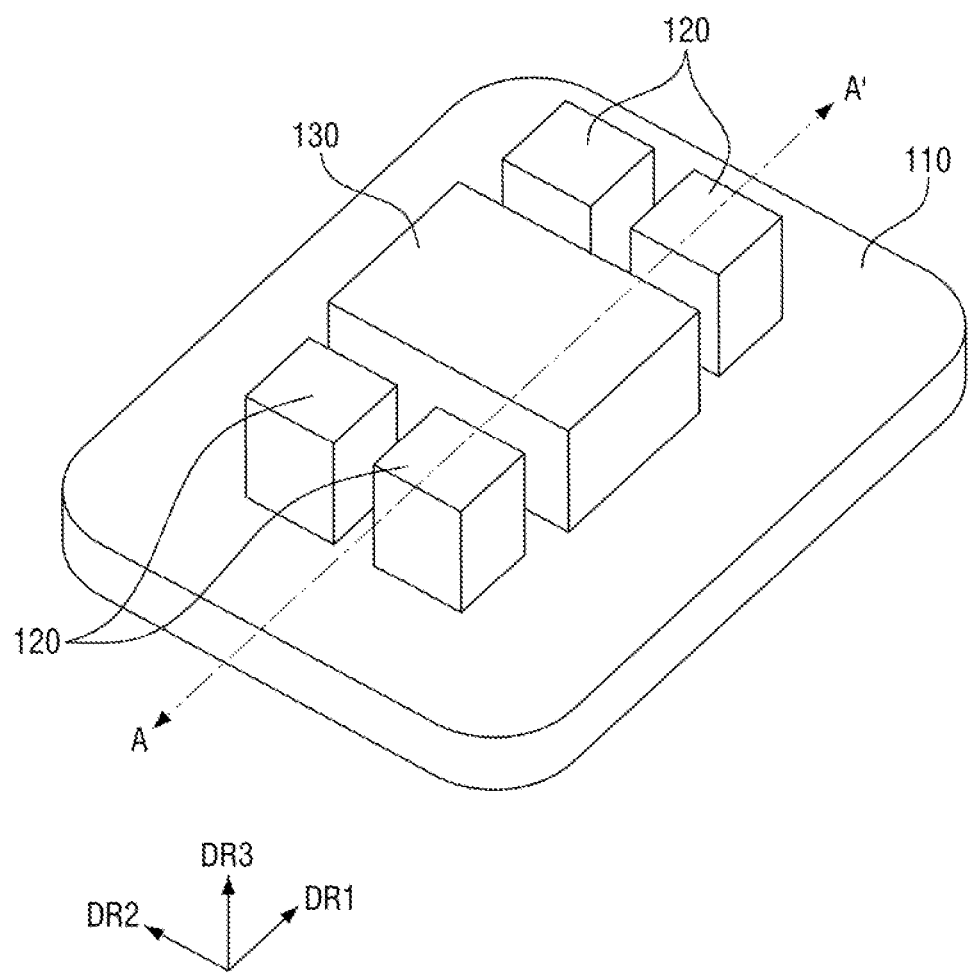
FIG. 1 is a perspective view of a semiconductor package according to an exemplary embodiment of the present inventive concepts.
Figure 2:
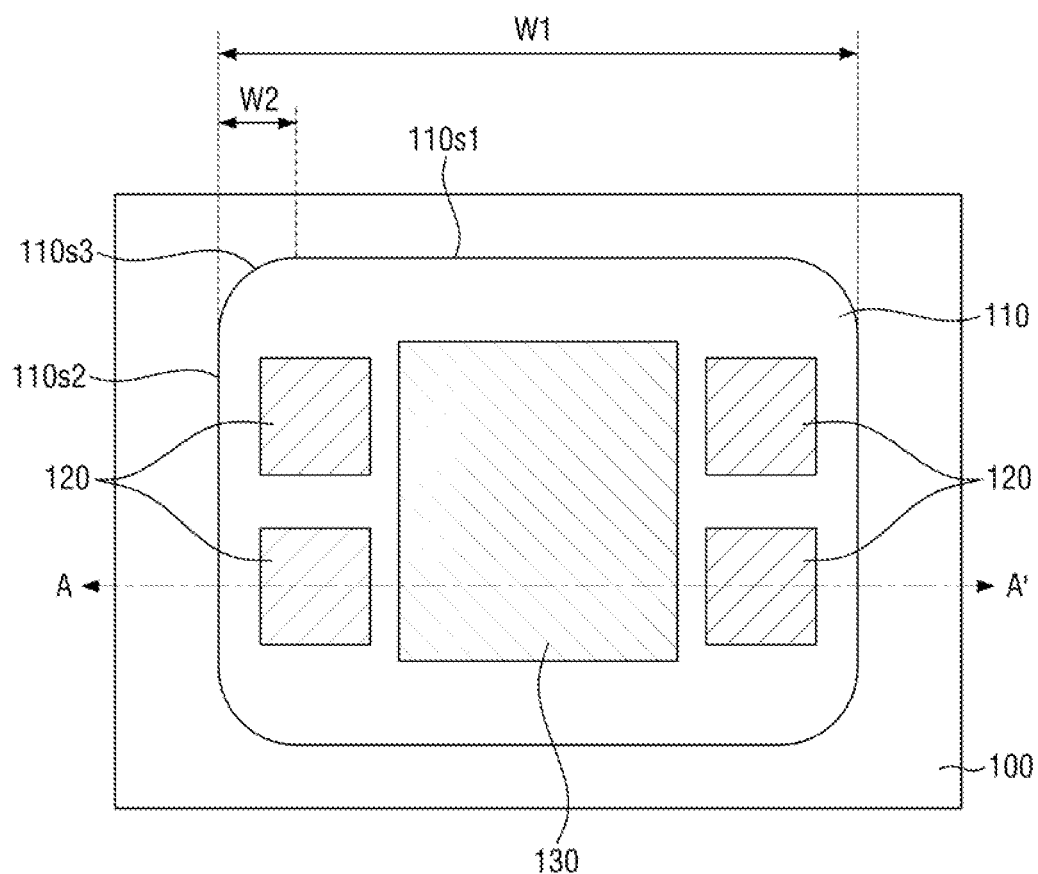
FIG. 2 is a plan view of a semiconductor package according to an exemplary embodiment of the present inventive concepts.
Figure 3:
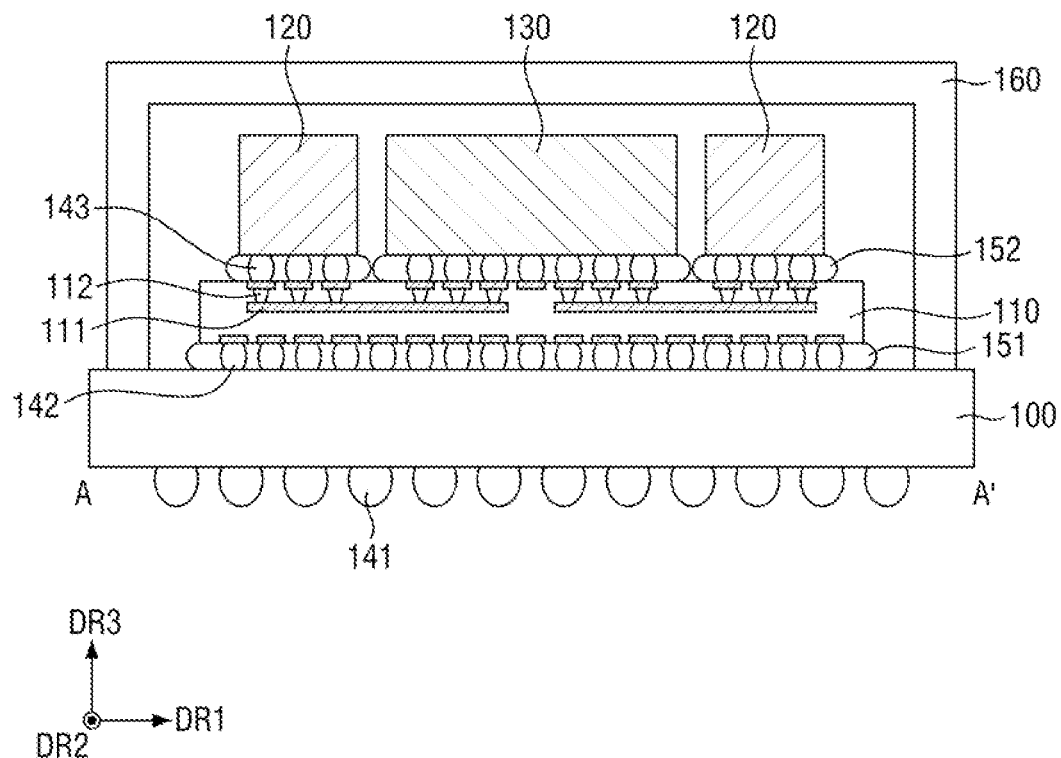
FIG. 3 is a cross-sectional view of a semiconductor device taken along a line A-A' of FIG. 2 according to an exemplary embodiment of the present inventive concepts.
Figure 4:
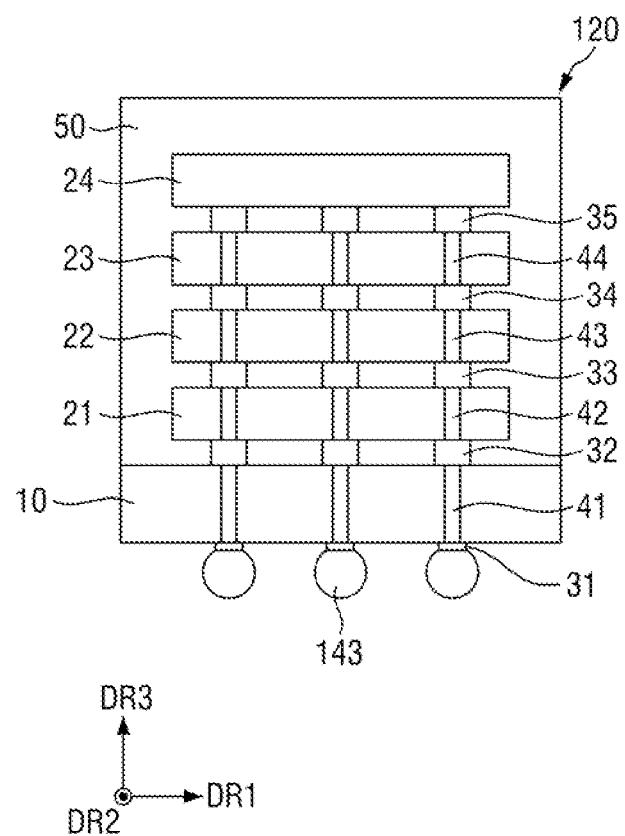
FIG. 4 is a cross-sectional of a memory package mounted on the semiconductor package according to an exemplary embodiment of the present inventive concepts.

FIG. 1 is a schematic perspective view for explaining a semiconductor package according to an exemplary embodiment of the present inventive concepts. FIG. 2 is a plan view for explaining the semiconductor package according to an exemplary embodiment of the present inventive concepts. FIG. 3 is a cross-sectional view taken along a line A-A' of FIG. 2. FIG. 4 is a cross-sectional view for explaining a memory package mounted on the semiconductor package according to an exemplary embodiment of the present inventive concepts. For convenience of explanation, a substrate 100 and a heat sink 160 are omitted from FIG. 1. In FIG. 2, the heat sink 160 is omitted for convenience of explanation.

Referring to FIGS. 1 to 4, a semiconductor package according to some exemplary embodiments of the present inventive concepts comprises a substrate 100, a first semiconductor chip 110, a second semiconductor chip 120, a third semiconductor chip 130, first to third solder balls 141, 142 and 143, first and second underfill materials 151 and 152, and a heat sink 160.

In an exemplary embodiment, the substrate 100 may be, for example, a printed circuit board (PCB) or a ceramic substrate. However, exemplary embodiments of the present inventive concepts are not limited thereto.

In an exemplary embodiment in which the substrate 100 is a printed circuit board, the substrate 100 may be made of at least one substance selected from phenol resin, epoxy resin, and polyimide. For example, the substrate 100 may comprise at least one substance selected from FR4, tetra-functional epoxy, polyphenylene ether, epoxy/polyphenylene oxide, BT (bismaleimide triazine), thermount, cyanate ester, polyimide, and liquid crystal polymer. Although a surface of the substrate 100 may be covered with a solder resist, exemplary embodiments of the present inventive concepts are not limited thereto.

The first solder ball 141 may be disposed on a lower surface of the substrate 100. For example, an upper surface of the first solder ball 141 may contact a lower surface of the substrate 100. In an exemplary embodiment, the first solder ball 141 may be in contact with a conductive terminal disposed on the lower surface of the substrate 100. As shown in the exemplary embodiment of FIG. 3, the first solder ball 141 may convexly protrude from the lower surface of the substrate 100. The first solder ball 141 may electrically connect the substrate 100 to another external element.

Although the first solder balls 141 may include, for example, at least one compound selected from tin (Sn), indium (In), lead (Pb), zinc (Zn), nickel (Ni), gold (Au), silver (Ag), copper (Cu), antimony (Sb), bismuth (Bi), and a combination thereof, exemplary embodiments of the present inventive concepts are not limited thereto.

The first semiconductor chip 110 may be disposed on an upper surface of the substrate 100. The first semiconductor chip 110 may be, for example, an interposer. However, exemplary embodiments of the present inventive concepts are not limited thereto. Hereinafter, for convenience of explanation, the first semiconductor chip 110 will be described as being an interposer.

The interposer 110 may be disposed on the upper surface of the substrate 100. The interposer 110 may include silicon. However, exemplary embodiments of the present inventive concepts are not limited thereto. For example, in some other exemplary embodiments, the interposer 110 may include at least one compound selected from glass, ceramic or plastic, etc.

As shown in the exemplary embodiment of FIG. 3, a plurality of wirings 111 and a plurality of vias 112 may be disposed inside the interposer 110. The plurality of wirings 111 are spaced apart from each other, and may comprise wirings disposed at different levels (e.g., at different distances from an upper surface of the substrate 100 in the third direction DR3). Each of the plurality of vias 112 may be disposed between two wirings of the plurality of wirings 111 that are on different levels from each other and may connect the plurality of wirings 111 disposed at different levels. The numbers of the plurality of wirings 111 and the arrangement of the plurality of vias 112 may vary and are not limited to those shown in the exemplary embodiment of FIG. 3.

As shown in the exemplary embodiment of FIG. 2, the interposer 110 may comprise a first sidewall 110s1 extending longitudinally in a first direction DR1, a second sidewall 110s2 extending longitudinally in a second direction DR2 that is different from the first direction DR1, and a third sidewall 110s3 disposed between the first sidewall 110s1 and the second sidewall 110s2 that connects the first sidewall 110s1 and the second sidewall 110s2 to each other. For example, as shown in the exemplary embodiment of FIG. 2, the interposer 110 may include two opposing first sidewalls 110s1 (e.g., an upper and a lower sidewall in the second direction DR2), two opposing second sidewalls 110s2 (e.g., a left and a right sidewall in the first direction DR1) and four third sidewalls 110s3 which each connect adjacent ends of a first sidewall 110s1 and a second sidewall 110s2 to each other.

As shown in the exemplary embodiment of FIGS. 1-4, the first direction DR1 and the second direction DR2 may be parallel to an upper surface of the substrate 100. The first and second directions DR1, DR2 may cross each other. For example, the first and second directions DR1, DR2 may be perpendicular to each other. However, exemplary embodiments of the present inventive concepts are not limited thereto and the first and second directions DR1, DR2 may cross each other at various different angles. The third direction DR3 may extend in a thickness direction of the substrate 100 and may be perpendicular to the first and second directions DR1, DR2. However, exemplary embodiments of the present inventive concepts are not limited thereto and the third direction DR3 may cross the first and second directions DR1, DR2 in various different angles.

The third sidewall 110s3 of the interposer 110 may have a curved surface shape. The third sidewall 110s3 of the interposer 110 having a curved, surface shape may be disposed to connect adjacent ends of the first and second sidewalls 110s1, 110s2 each extending in the first direction DR1 and the second direction DR2, respectively. For example, as shown in FIG. 2, the interposer 110 may comprise four third sidewalls 110s3 having a curved surface shape which each connects a first sidewall 110s1 to a second sidewall 110s2. While the interposer 110 is shown in FIG. 2 as having a rectangular shape with curved corners, exemplary embodiments of the present inventive concepts are not limited thereto and the interposer 110 may have numerous different shapes in which third sidewalls 110s3 having a curved shape connects a first sidewall 110s1 and a second sidewall 110s2 which extend in a first direction DR1 and second direction DR2, which cross each other. For example, the interposer 110 may have a triangular shape with curved corners or another polygonal shape with curved corners in another exemplary embodiment.

In an exemplary embodiment, a first width W1 of the interposer 110 (e.g., length in the first direction DR1) may be in a range of about 20 mm to about 80 mm. For example, as shown in the exemplary embodiment of FIG. 2, the first width W1 may include one first sidewall 110s1 and two third sidewalls 110s3. In an exemplary embodiment, a second width W2 (e.g., length in the first direction DR1) of each third sidewall 110s3 of the two third sidewalls 110s3 included in the first width W2 interposer 110 may be in a range of about 1 mm to about 10 mm.

The second solder ball 142 may be disposed on the lower surface of the interposer 110. For example, an upper surface of the second solder ball 142 may contact the lower surface of the interposer 110 and a lower surface of the second solder ball 142 may contact an upper surface of the substrate 100. The second solder ball 142 may be in contact with the plurality of wirings 111 disposed on the lower surface of the interposer 110. The second solder ball 142 may convexly protrude from the lower surface of the interposer 110. The second solder ball 142 may be in contact with a conductive terminal disposed on the upper surface of the substrate 100. The interposer 110 may be electrically connected to the substrate 100 through the second solder balls 142.

In an exemplary embodiment, the second solder ball 142 may include at least one compound selected from tin (Sn), indium (In), lead (Pb), zinc (Zn), nickel (Ni), gold (Au), silver (Ag), copper (Cu), antimony (Sb), bismuth (Bi), and a combination thereof. However, exemplary embodiments of the present inventive concepts are not limited thereto.

A first underfill material 151 may be disposed to wrap the lateral side surface of the second solder ball 142, between the upper surface of the substrate 100 and the lower surface of the interposer 110. Although the exemplary embodiment of FIG. 3 shows the first underfill material 151 formed to protrude laterally (e.g., in the first direction DR1) from the lateral side surface of the interposer 110, exemplary embodiments of the present inventive concepts are not limited to thereto.

The second semiconductor chip 120 may be disposed on the upper surface of the interposer 110. The second semiconductor chip 120 may include a plurality of second semiconductor chips. While FIG. 2 illustrates four second semiconductor chips 120 disposed on the interposer 110 and spaced apart from each other in the first and second directions DR1 and DR2, this is for convenience of explanation. In other exemplary embodiments of the present inventive concepts, the number of the second semiconductor chips 120 disposed on the upper surface of the interposer 110 may vary and their arrangement with respect to each other may vary.

In an exemplary embodiment, the second semiconductor chip 120 may be, for example, a memory package comprising a plurality of memory semiconductor chips. For example as shown in the exemplary embodiment of FIG. 4, the second semiconductor chip 120 may include first to fourth memory semiconductor chips 21, 22, 23 and 24.

For example, as shown in the exemplary embodiment of FIG. 4, the second semiconductor chip 120 may comprise a buffer semiconductor chip 10, the first to fourth memory semiconductor chips 21, 22, 23 and 24, the first to fifth connection terminals 31, 32, 33, 34 and 35, first to fourth HBM penetration vias 41, 42, 43 and 44, and an HBM mold layer 50.

The buffer semiconductor chip 10 may be disposed at the bottom of the second semiconductor chip 120 (e.g., in the third direction DR3). The first to fourth memory semiconductor chips 21, 22, 23 and 24 may be sequentially stacked on the buffer semiconductor chip 10 (e.g., in the third direction DR3) and may be spaced apart from each other. Although FIG. 4 shows that four memory semiconductor chips are stacked on the buffer semiconductor chip 10, exemplary embodiments of the present inventive concepts are not limited thereto. For example, the number of memory semiconductor chips stacked on the buffer semiconductor chip 10 is not limited and may vary in other exemplary embodiments.

In an exemplary embodiment, each of the first to fourth memory semiconductor chips 21, 22, 23 and 24 may be a volatile memory semiconductor chip such as a DRAM (Dynamic Random Access Memory) or a SRAM (Static Random Access Memory), or may be a non-volatile memory semiconductor chip such as a PRAM (Phase-change Random Access Memory), a MRAM (Magnetoresistive Random Access Memory), a FeRAM (Ferroelectric Random Access Memory) or a RRAM (Resistive Random Access Memory). However, exemplary embodiments of the present inventive concepts are not limited thereto.

A first connection terminal 31 may be disposed an the lower surface of the buffer semiconductor chip 10. For example, the first connection terminal 31 may be disposed directly on the lower surface of the buffer semiconductor chip 10. The first connection terminal 31 may include a conductive substance. The first connection terminal 31 may be electrically connected to a third solder ball 143.

A second connection terminal 32 may be disposed between the buffer semiconductor chip 10 and the first memory semiconductor chip 21 (e.g., in the third direction DR3). A third connection terminal 33 may be disposed between the first memory semiconductor chip 21 and the second memory semiconductor chip 22 (e.g., in the third direction DR3). A fourth connection terminal 34 may be disposed between the second memory semiconductor chip 22 and the third memory semiconductor chip 23 (e.g., in the third direction DR3). A fifth connection terminal 35 may be disposed between the third memory semiconductor chip 23 and the fourth memory semiconductor chip 24 (e.g., in the third direction DR3). Each of the second to fifth connection terminals 32, 33, 34 and 35 may include a conductive substance. While the exemplary embodiment of FIG. 4 shows that the second semiconductor chip 120 includes three of each of the second to fifth connection terminals 32, 33, 34, 35, exemplary embodiments of the present inventive concepts are not limited thereto.

A first HBM penetration via 41 may be disposed to penetrate the buffer semiconductor chip 10 in the third direction DR3. The first HBM penetration via 41 may be connected to each of the first connection terminal 31 and the second connection terminal 32.

A second HBM penetration via 42 may be disposed to penetrate the first memory semiconductor chip 21 in the third direction DR3. The second HBM penetration via 42 may be connected to each of the second connection terminal 32 and the third connection terminal 33.

A third HBM penetration via 43 may be disposed to penetrate the second memory semiconductor chip 22 in the third direction DR3. The third HBM penetration via 43 may be connected to each of the third connection terminal 33 and the fourth connection terminal 34.

A fourth HBM penetration via 44 may be disposed to penetrate the third memory semiconductor chip 23 in the third direction DR3. The fourth HBM penetration via 44 may be connected to each of the fourth connection terminal 34 and the fifth connection terminal 35. While the exemplary embodiment of FIG. 4 shows that the second semiconductor chip 120 includes three of each of the first HBM penetration vias 41, second HBM penetration vias 42, third HBM penetration vias 43 and fourth HBM penetration vias 44, exemplary embodiments of the present inventive concepts are not limited thereto.

The first to fourth memory semiconductor chips 21, 22, 23 and 24 may be electrically connected to the buffer semiconductor chip 10 through the second to fifth connection terminals 32, 33, 34 and 35 and the second to fourth HBM penetration vias 42, 43 and 44.

The HBM mold layer 50 may be disposed to cover the first to fourth memory semiconductor chips 21, 22, 23 and 24 on the upper surface of the buffer semiconductor chip 10. The HBM mold layer 50 may cover top, bottom and lateral side surfaces of the first to fourth memory semiconductor chips 21, 22, 23, 24. For example, the HBM mold layer 50 may be disposed between the buffer semiconductor chip 10 and the first memory semiconductor chip 21, between the first memory semiconductor chip 21 and the second memory semiconductor chip 22, between the second memory semiconductor chip 22 and the third memory semiconductor chip 23, and between the third memory semiconductor chip 23 and the fourth memory semiconductor chip 24.

In an exemplary embodiment, the HBM mold layer 50 may include an epoxy molding compound (EMC) or two or more kinds of silicon hybrid substances.

The third semiconductor chip 130 may be disposed on the upper surface of the interposer 110. Although FIG. 2 shows that the third semiconductor chip 130 is disposed between the second semiconductor chips 120 (e.g., in the first direction DR1), this is for convenience of explanation, and the present inventive concepts are not limited thereto. For example, in some other exemplary embodiments, the third semiconductor chip 130 may be disposed on the lower surface of the interposer 110 or may have various other arrangements.

In an exemplary embodiment, the third semiconductor chip 130 may be a logic semiconductor chip. The third semiconductor chip 130 may be a micro-processor. For example, the third semiconductor chip 130 may be a central processing unit (CPU), a controller, an on-demand semiconductor (an application specific integrated circuit, ASIC), or the like. However, exemplary embodiments of the present inventive concepts are not limited thereto.

The third solder ball 143 may be disposed on the lower surfaces of each of the second semiconductor chip 120 and the third semiconductor chip 130. For example, a lower surface of the third solder ball 143 may contact an upper surface of the interposer 110 and an upper surface of the third solder ball 143 may contact lower surfaces of the second semiconductor chip 120 and third semiconductor chip 130. The third solder ball 143 may convexly protrude from the lower surfaces of each of the second semiconductor chip 120 and the third semiconductor chip 130. A lower surface of the third solder ball 143 may be in contact with the plurality of wirings 111 disposed on the upper surface of the interposer 110 and an upper surface of the third solder ball 143 may be contact with lower surfaces of the second semiconductor chip 120 and the third semiconductor chip 130.

As shown in the exemplary embodiment of FIG. 3, the second semiconductor chip 120 may be electrically connected to the interposer 110 through the third solder ball 143. The third semiconductor chip 130 may also be electrically connected to the interposer 110 through the third solder ball 143. In this exemplary embodiment, the interposer 110 may electrically connect the second semiconductor chip 120 to the third semiconductor chip 130.

In an exemplary embodiment, the third solder ball 143 may include at least one compound selected from tin (Sn), indium (In), lead (Pb), zinc (Zn), nickel (Ni), gold (Au), silver (Ag), copper (Cu), antimony (Sb), bismuth (Bi), and a combination thereof. However, exemplary embodiments of the present inventive concepts are not limited thereto.

A second underfill material 152 may be disposed to wrap the lateral side surface of the third solder ball 143, between the upper surface of the interposer 110 and the lower surface of the second semiconductor chip 120 (e.g., in the third direction DR3). Although the exemplary embodiment shown in FIG. 3 shows the second underfill material 152 formed to further protrude laterally (e.g., in the first direction DR1) from the side surface of the second semiconductor chip 120, exemplary embodiments of the present inventive concepts are not limited thereto.

Further, the second underfill material 152 may be disposed to wrap the lateral side surface of the third solder ball 143, between the upper surface of the interposer 110 and the lower surface of the third semiconductor chip 130. Although the exemplary embodiment shown in FIG. 4 shows the second underfill material 152 formed to further protrude laterally from the side surface of the third semiconductor, exemplary embodiments of the present inventive concepts are not limited thereto.

As shown in the exemplary embodiment of FIG. 3, the heat sink 160 may be disposed on the substrate 100 to cover the interposer 110, the second semiconductor chip 120 and the third semiconductor chip 130. However, exemplary embodiments of the present inventive concepts are not limited thereto. For example, in some other exemplary embodiments, the heat sink 160 may not be disposed on top of each of the second semiconductor chip 120 and the third semiconductor chip 130.

Although FIG. 3 shows that the heat sink 160 is disposed to be spaced apart from the second semiconductor chip 120 and the third semiconductor chip 130 (e.g., in the third direction DR3), exemplary embodiments of the present inventive concepts are not limited thereto. For example, in some other exemplary embodiments, an adhesive layer may be disposed between the heat sink 160 and at least one of the second semiconductor chip 120 and the third semiconductor chip 130.

The semiconductor package according to some exemplary embodiments of the present inventive concepts is configured such that at least a partial portion of a sidewall of the interposer 110 is formed into a curved surface to prevent a crack from being generated in a lower part of the interposer 110, thereby improving the reliability of the semiconductor package.

Hereinafter, a method for fabricating a semiconductor package according to some exemplary embodiments of the present inventive concepts will be described with reference to FIGS. 3 and 5 to 7.

Figure 5:
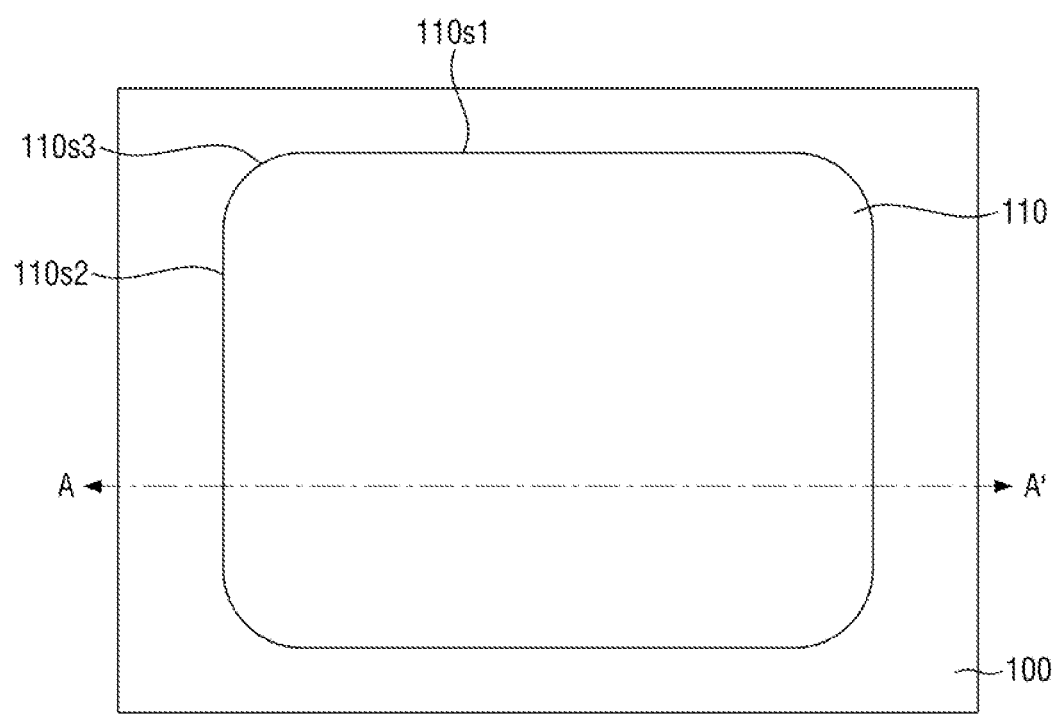
FIGS. 5 to 7 are intermediate stage diagrams of a method for fabricating a semiconductor package according to exemplary embodiments of the present inventive concepts.
Figure 5:
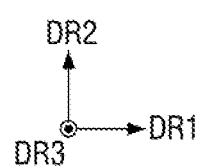
Figure 6:
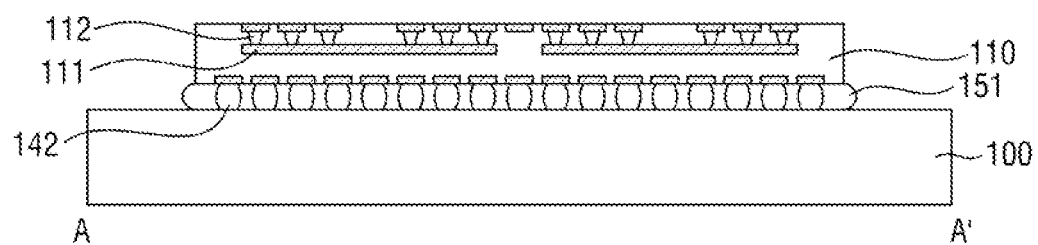
Figure 6:
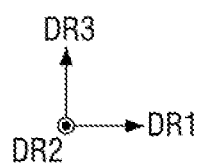
Figure 7:
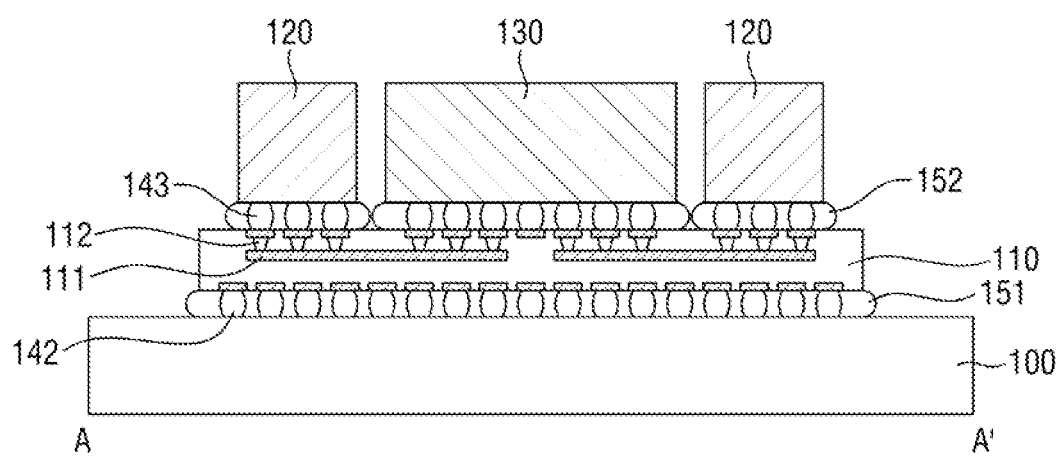
Figure 7:
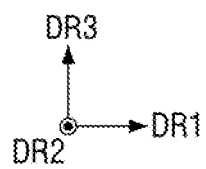

FIGS. 5 to 7 are intermediate stage diagrams of a method for fabricating a semiconductor package according to some exemplary embodiments of the present inventive concepts. FIG. 6 is a cross-sectional view taken along the line A-A' of FIG. 5.

Referring to the exemplary embodiments of FIGS. 5 and 6, an interposer 110 may be formed on the substrate 100. In this exemplary embodiment, the interposer 110 may comprise a first sidewall 110s1 extending in the first direction DR1, a second sidewall 110s2 extending in the second direction DR2, and a third sidewall 110s3 which connects the first sidewall 110s1 and the second sidewall 110s2. The third sidewall 110s3 of the interposer 110 may have a curved surface shape. While the exemplary embodiment shown in FIG. 5 shows the interposer 110 having a rectangular shape with curved corners, exemplary embodiments of the present inventive concepts are not limited thereto.

The interposer 110 may be electrically connected to the substrate 100 through the second solder ball 142. The first underfill material 151 may be formed to wrap a lateral side surface of the second solder ball 142, between the upper surface of the substrate 100 and the lower surface of the interposer 110 (e.g., in the third direction DR3).

Referring to the exemplary embodiment of FIG. 7, each of a second semiconductor chip 120 and a third semiconductor chip 130 may be formed on the upper surface of the interposer 110.

The second semiconductor chip 120 may be electrically connected to the interposer 110 through the third solder ball 143. The third semiconductor chip 130 may also be electrically connected to the interposer 110 through the third solder ball 143. In this exemplary embodiment, the second semiconductor chip 120 may be electrically connected to the third semiconductor chip 130 through the interposer 110.

The heat sink 160 may then be formed on the upper surface of the substrate 100 to cover the interposer 110, the second semiconductor chip 120 and the third semiconductor chip 130, and the first solder ball 141 may be formed on the lower surface of the substrate 100. The semiconductor package shown in FIG. 3 may be fabricated through the aforementioned processes.

Hereinafter, a semiconductor package according to some exemplary embodiments of the present inventive concepts will be described with reference to FIGS. 8 to 10. Differences from the semiconductor package shown in FIGS. 1 to 4 will be mainly explained and a description of substantially identical elements will be omitted for convenience of explanation.

Figure 8:
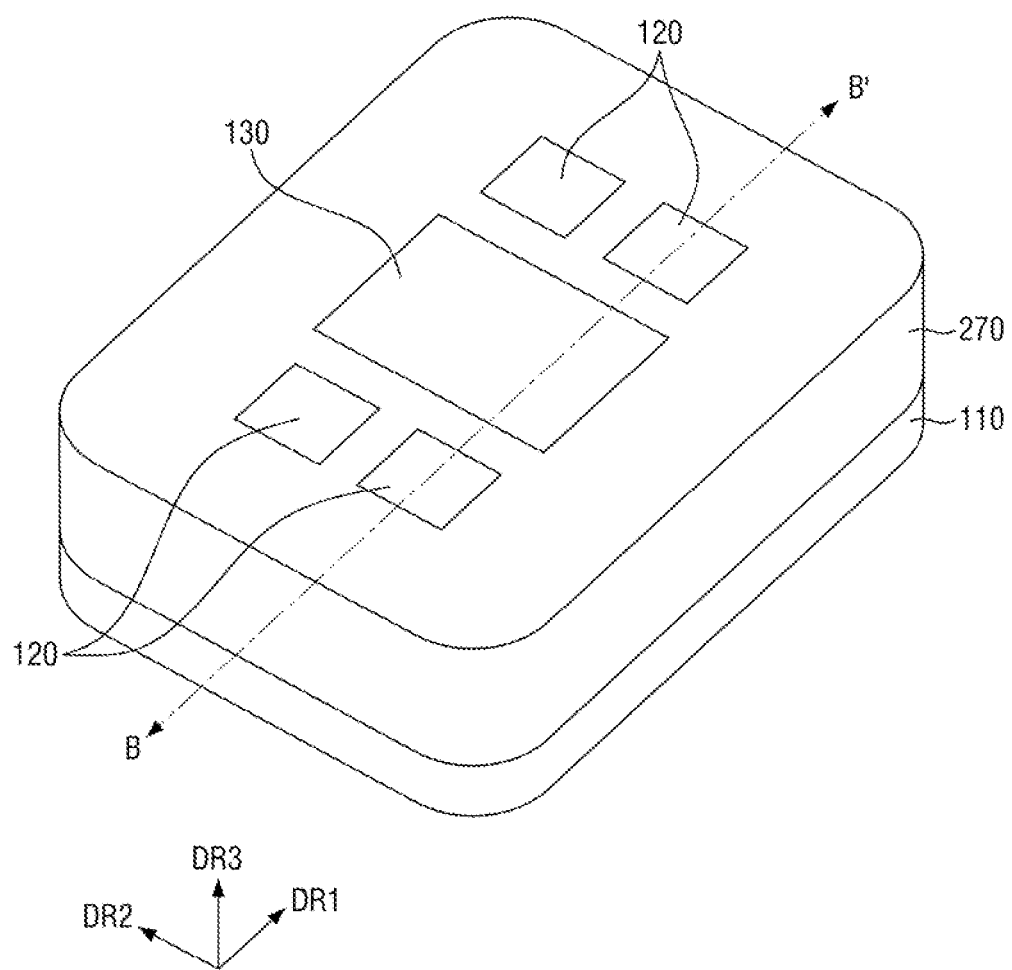
FIG. 8 is a perspective view of a semiconductor package according to an exemplary embodiment of the present inventive concepts.

FIG. 8 is a schematic perspective view for explaining a semiconductor package according to some exemplary embodiments of the present inventive concepts. FIG. 9 is a plan view for explaining a semiconductor package according to some exemplary embodiments of the present inventive concepts. FIG. 10 is a cross-sectional view taken along a line B-B' of FIG. 9.

Figure 9:
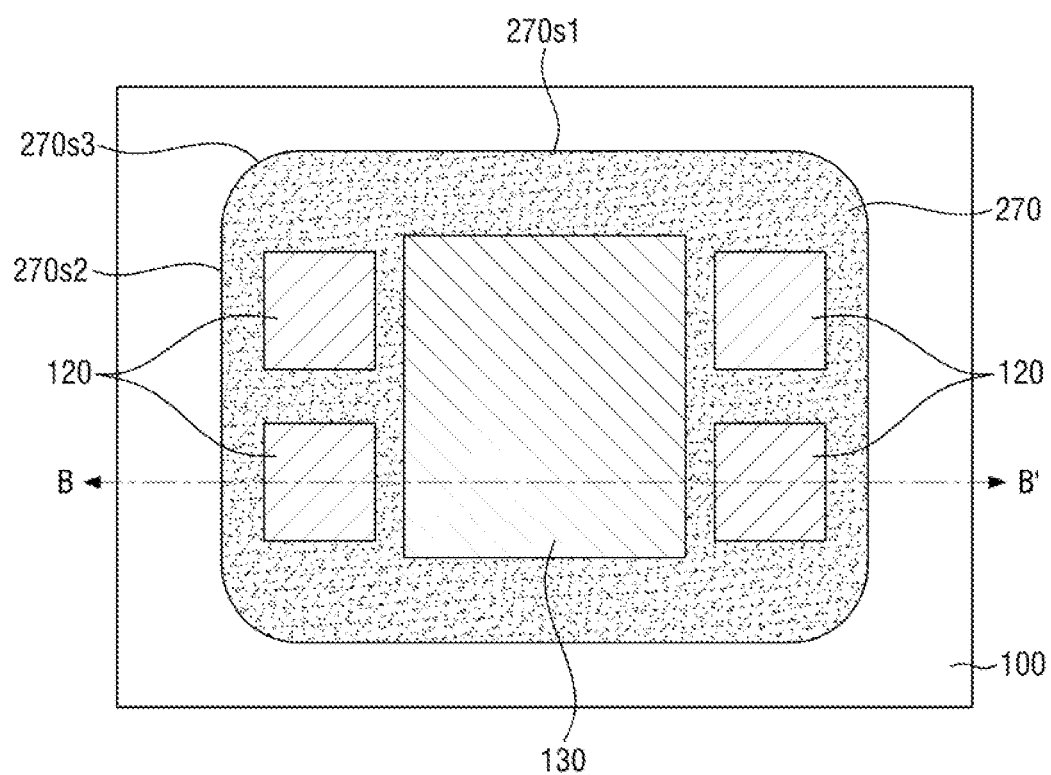
FIG. 9 is a plan view of a semiconductor package according to an exemplary embodiment of the present inventive concepts.
Figure 10:
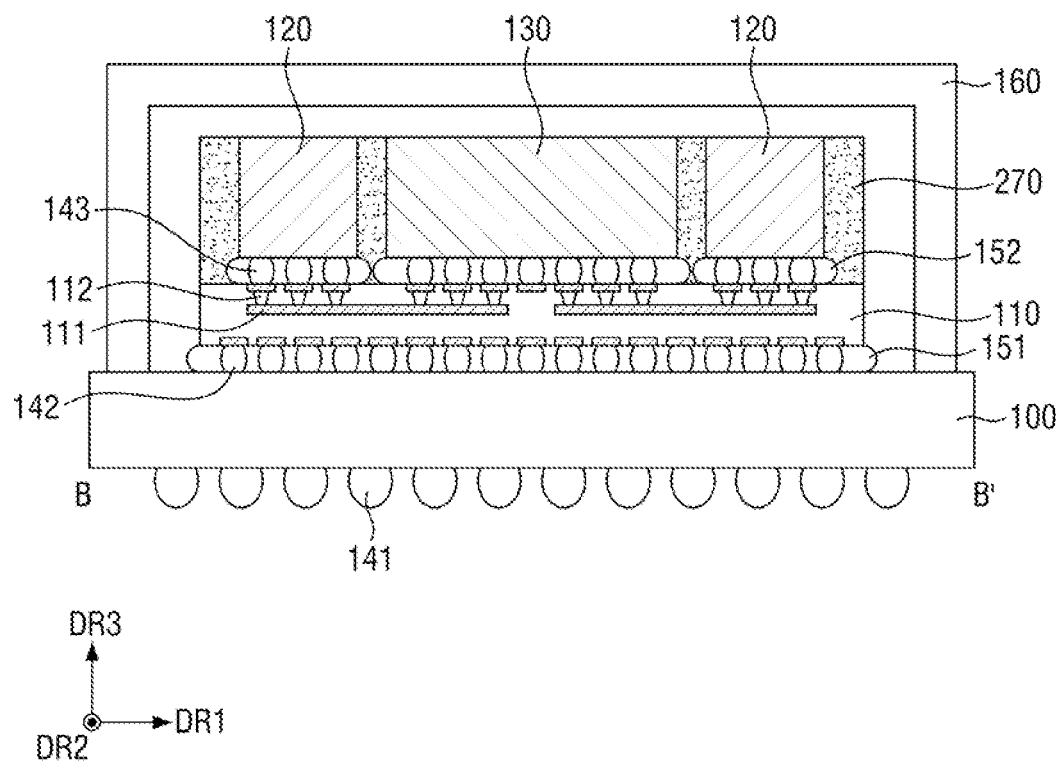
FIG. 10 is a cross-sectional view of a semiconductor package taken along line B-B' of FIG. 9 according to an exemplary embodiment of the present inventive concepts.

Referring to FIGS. 8 to 10, the semiconductor package according to exemplary embodiments of the present inventive concepts may comprise a first mold layer 270 disposed on the upper surface of the interposer 110. The first mold layer 270 may wrap each sidewall of the second semiconductor chip 120 and the third semiconductor chip 130.

The first mold layer 270 may comprise a first sidewall 270s1 extending in the first direction DR1, a second sidewall 270s2 extending in the second direction DR2, and a third sidewall 270s3 which connects the first sidewall 270s1 and the second sidewall 270s2. The third sidewall 270s3 of the first mold layer 270 may have a curved surface shape. For example, as shown in the exemplary embodiment of FIG. 9, the first mold layer 270 may have a rectangular shape with curved corners and may include two first sidewalls 270s1 opposing each other in the second direction DR2, two second sidewalls 270s2 opposing each other in the first direction DR1 and four third sidewalls 270s3 which each connect adjacent ends of a first sidewall 270s1 and a second sidewall 270s3 to each other. However, exemplary embodiments of the present inventive concepts are not limited thereto and the first mold layer 270 may have numerous different shapes in which third sidewalls 270s3 having a curved shape each connects a first sidewall 270s1 and a second sidewall 270s2 which extend in a first direction DR1 and second direction DR2, respectively, which cross each other.

In an exemplary embodiment, the first sidewall 270s1 of the first mold layer 270 may completely overlap the first sidewall (110s1 of FIG. 2 of) the interposer 110 in the third direction DR3. The second sidewall 270s2 of the first mold layer 270 may completely overlap the second sidewall (110s2 of FIG. 2) of the interposer 110 in the third direction DR3. The third sidewall 270s3 of the first mold layer 270 may completely overlap the third sidewall (110s3 of FIG. 2) of the interposer 110 in the third direction DR3. However, exemplary embodiments of the present inventive concepts are not limited thereto.

In an exemplary embodiment, the upper surface of the first mold layer 270 may be formed on the same plane as at least one of the upper surface of the second semiconductor chip 120 and the upper surface of the third semiconductor chip 130. For example, the upper surface of the first mold layer 270 and at least one of the upper surface of the second semiconductor chip 120 and the upper surface of the third semiconductor chip 130 may be formed in a plane defined in the first and second directions DR1, DR2. However, exemplary embodiments of the present inventive concepts are not limited thereto. In some other exemplary embodiments, the first mold layer 270 may be disposed to cover each of the upper surface of the second semiconductor chip 120 and the upper surface of the third semiconductor chip 130 and may extend above the upper surfaces of the second semiconductor chip 120 and the third semiconductor chip 130.

In an exemplary embodiment, the first mold layer 270 may include an epoxy molding compound (EMC) or two or more kinds of silicon hybrid substances. However, exemplary embodiments of the present inventive concepts are not limited thereto.

Hereinafter, a method for fabricating a semiconductor package according to some exemplary embodiments of the present inventive concepts will be described with reference to FIGS. 10 to 13. FIG. 12 is a cross-sectional view taken along the line B-B' of FIG. 11.

Figure 11:
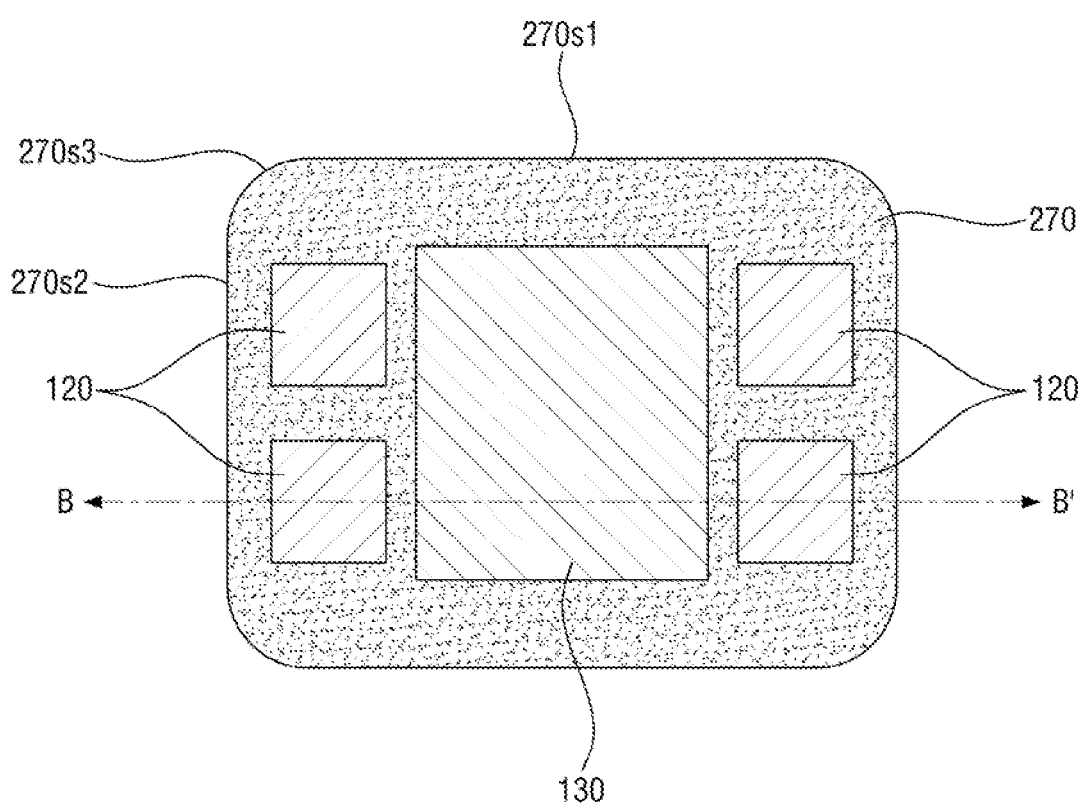
FIGS. 11 to 13 are intermediate stage diagrams of a method for fabricating a semiconductor package according to exemplary embodiments of the present inventive concepts.
Figure 12:
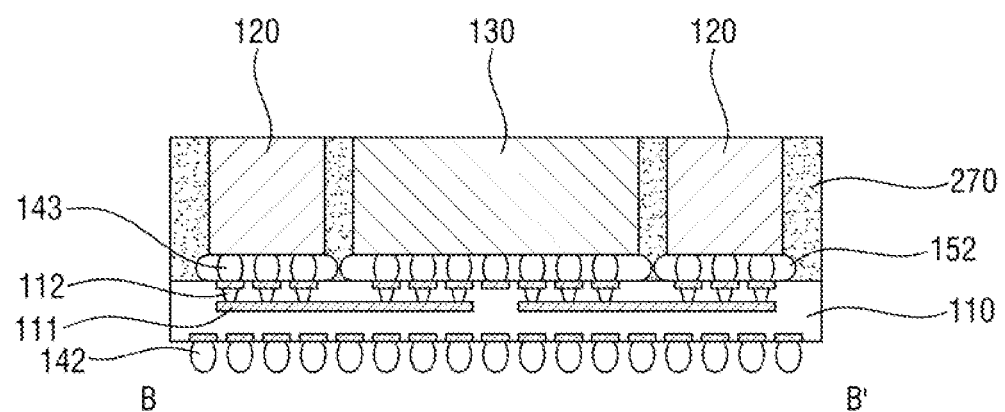
Figure 12:
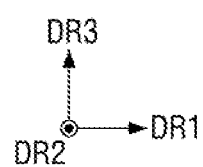

Referring to FIGS. 11 and 12, each of the second semiconductor chip 120 and the third semiconductor chip 130 may be formed on an interposer wafer.

The second semiconductor chip 120 may be electrically connected to the interposer wafer through the third solder ball 143. The third semiconductor chip 130 may also be electrically connected to the interposer wafer through the third solder balls 143. In this exemplary embodiment, the second semiconductor chip 120 may be electrically connected to the third semiconductor chip 130 through the interposer wafer.

A first mold layer 270 may then be formed on the interposer wafer to cover each of the second semiconductor chip 120 and the third semiconductor chip 130. The first mold layer 270 may cover lateral side surfaces of the second semiconductor chip 120, the third semiconductor chip 130 and lateral side surfaces and an upper surface of the second underfill material 152. The upper surface of the second semiconductor chip 120 and the upper surface of the third semiconductor chip 130 may then be exposed through a planarization process, such as a CMP process. However, exemplary embodiments of the present inventive concepts are not limited thereto.

The interposer wafer may then be sawed to form a structure shown in FIG. 12 comprising the interposer 110. Through the process of sawing the interposer wafer, at least one first sidewall (110s1 of FIG. 2) extending in the first direction DR1, at least one second sidewall (110s2 of FIG. 2) extending in the second direction DR2, and at least one third sidewall (110s3 of FIG. 2) which connects the first sidewall (110s1 of FIG. 2) and the second sidewall (110s2 of FIG. 2) may be formed on the interposer 110. The third sidewall (110s3 of FIG. 2 of) the interposer 110 may have a curved surface shape.

In addition, through the process of sawing the interposer wafer, a first sidewall 270s1 extending in the first direction DR1, a second sidewall 270s2 extending in the second direction DR2, and a third sidewall 270s3 which connects the first sidewall 270s1 and the second sidewall 270s2 may be formed in the first mold layer 270. The third sidewall 270s3 of the first mold layer 270 may have a curved surface shape.

Figure 13:
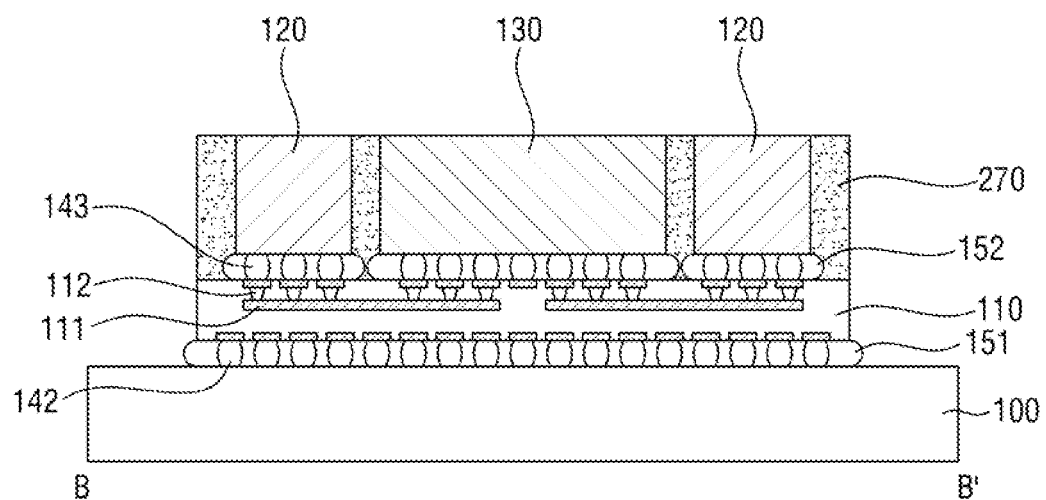

Referring to FIG. 13, the structure shown in FIG. 12 may be bonded on the upper surface of the substrate 100. The interposer 110 may be electrically connected to the substrate 100 through the second solder ball 142 which extends between a lower surface of the interposer 110 and an upper surface of the substrate 100 (e.g., in the third direction DR3). The first underfill material 151 may be formed to wrap a lateral side surface of the second solder ball 142, between the upper surface of the substrate 100 and the lower surface of the interposer 110 (e.g., in the third direction DR3).

The heat sink 160 may then be formed on the upper surface of the substrate 100 to cover the interposer 110, the second semiconductor chip 120, the third semiconductor chip 130, and the first mold layer 270. The first solder ball 141 may be formed on the lower surface of the substrate 100. The semiconductor package shown in FIG. 10 may be fabricated through the aforementioned processes.

Hereinafter, a semiconductor package according to some exemplary embodiments of the present inventive concepts will be described with reference to FIG. 14. Differences from the semiconductor package shown in FIGS. 1 to 4 will be mainly explained and a description of substantially identical elements will be omitted for convenience of explanation.

Figure 14:
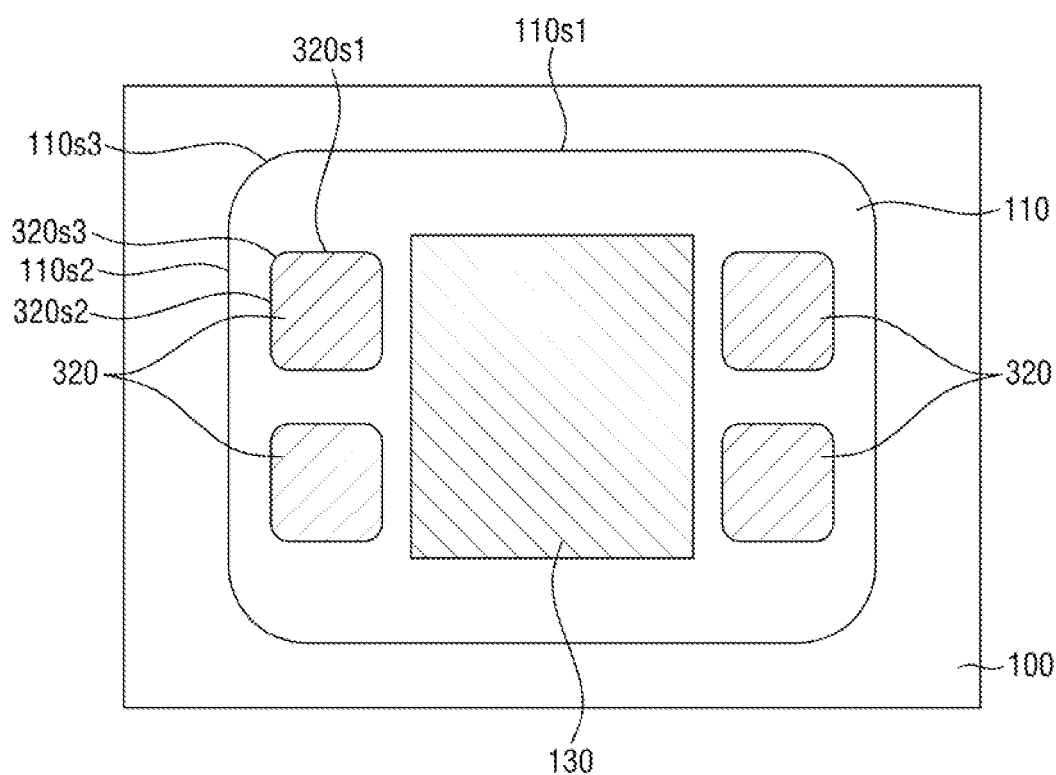
FIG. 14 is a plan view of a semiconductor package according to an exemplary embodiment of the present inventive concepts.
Figure 14:
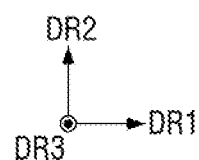

FIG. 14 is a plan view for explaining a semiconductor package according to an exemplary embodiment of the present inventive concepts.

Referring to FIG. 14, in the semiconductor package according to an exemplary embodiment of the present inventive concepts, the second semiconductor chip 320 may comprise a first sidewall 320s1 extending in the first direction DR1, a second sidewall 320s2 extending in the direction DR2, and a third sidewall 320s3 that connects the first sidewall 320s1 and the second sidewall 320s2. The third sidewall 320s3 of the second semiconductor chip 320 may have a curved surface shape as opposed to the second semiconductor chip 120 shown in FIGS. 1-2 in which each of the sidewalls of the second semiconductor chip 120 are straight (e.g., extending in the first direction DR1 or second direction DR2).

Hereinafter, a semiconductor package according to some exemplary embodiments of the present inventive concepts will be described with reference to FIG. 15. Differences from the semiconductor package shown in FIGS. 1 to 4 will be mainly explained and a description of substantially identical elements will be omitted for convenience of explanation.

Figure 15:
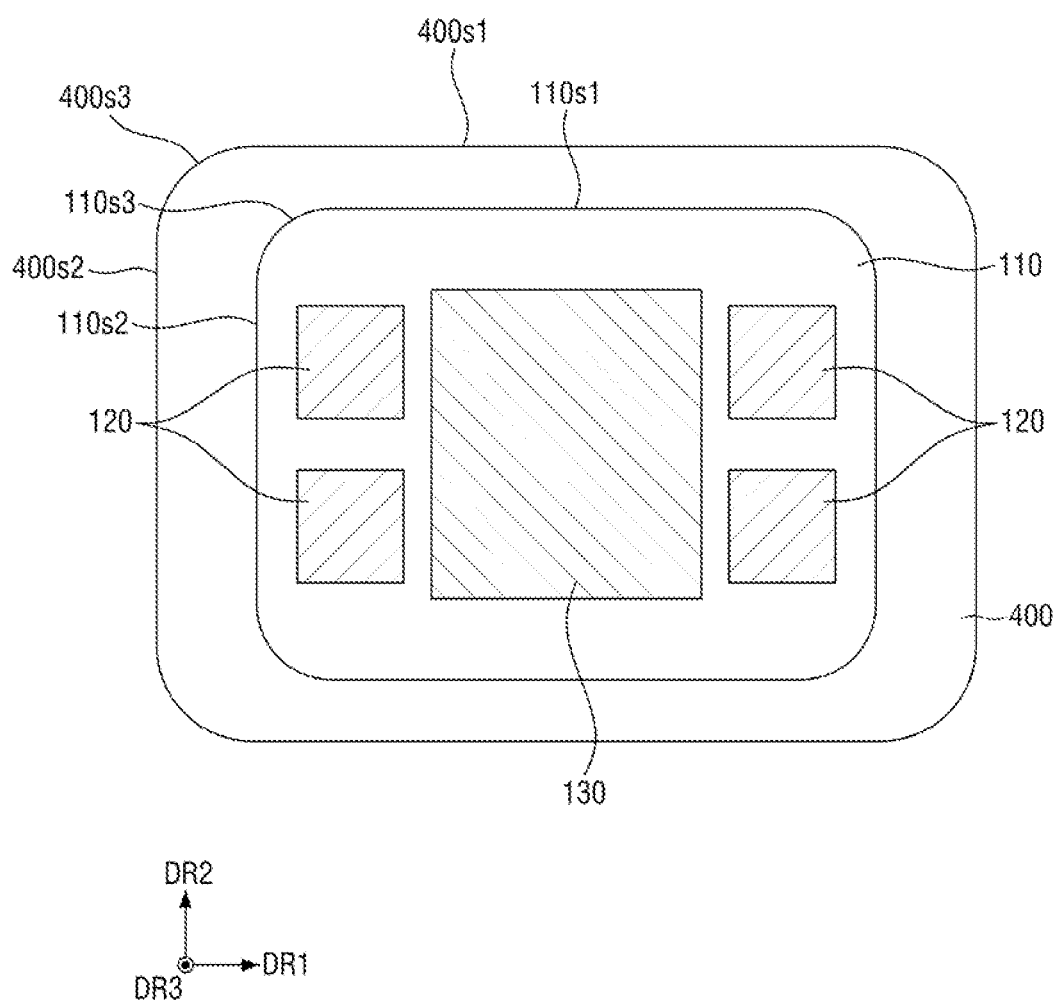
FIG. 15 is a plan view of a semiconductor package according to an exemplary embodiment of the present inventive concepts.

FIG. 15 is a plan view for explaining a semiconductor package according to an exemplary embodiment of the present inventive concepts.

Referring to FIG. 15, in the semiconductor package according to an exemplary embodiment of the present inventive concepts, a substrate 400 may comprise a first sidewall 400s1 extending in the first direction DR1, a second sidewall 200s2 extending, in the second direction DR2, and a third sidewall 400s3 that connects the first sidewall 400s1 and the second sidewall 400s2. The third sidewall 400s3 of the substrate 400 may have a curved surface shape as opposed to the substrate 100 shown in FIGS. 1-2 in which each of the sidewalls of the substrate 100 are straight. For example, as shown in the exemplary embodiment of FIG. 15, the substrate 400 may have a rectangular shape with curved corners and may include two first sidewalls 400s1 opposing each other in the second direction DR2, two second sidewalls 400s2 opposing each other in the first direction DR1 and four third sidewalls 400s3 which each connect adjacent ends of a first sidewall 400s1 and a second sidewall 400s2 to each other. However, exemplary embodiments of the present inventive concepts are not limited thereto and the substrate 400 may have numerous different shapes in which third sidewalls 400s3 having a curved shape each connects a first sidewall 270s1 and a second sidewall 270s2 which extend in a first direction DR1 and second direction DR2, respectively, which cross each other.

Hereinafter, a semiconductor package according to some exemplary embodiments of the present inventive concepts will be described with reference to FIGS. 16 and 17. Differences from the semiconductor package shown in FIGS. 1 to 4 will be mainly explained and a description of substantially identical elements will be omitted for convenience of explanation.

Figure 16:
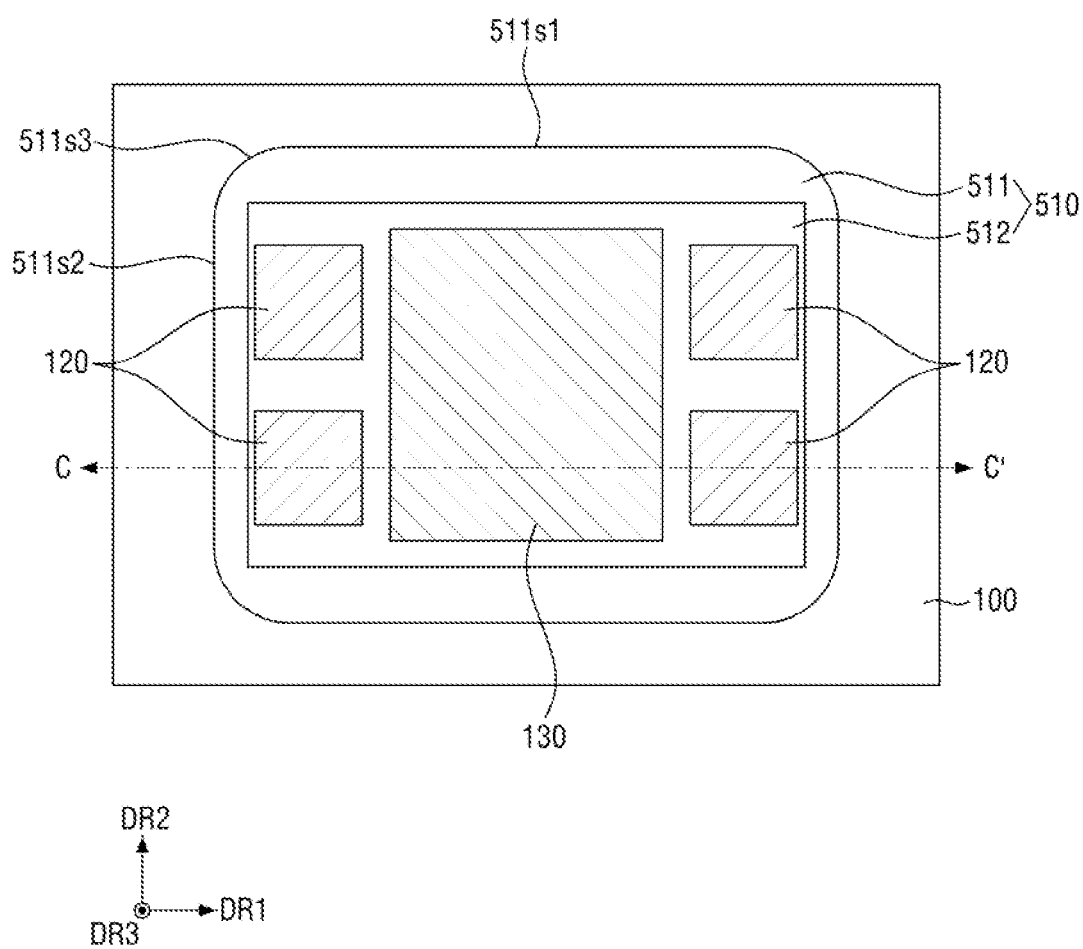
FIG. 16 is a plan view of a semiconductor package according to an exemplary embodiment of the present inventive concepts.

FIG. 16 is a plan view for explaining a semiconductor package according to an exemplary embodiment of the present inventive concepts. FIG. 17 is a cross-sectional view taken along a line C-C' of FIG. 16.

Figure 17:
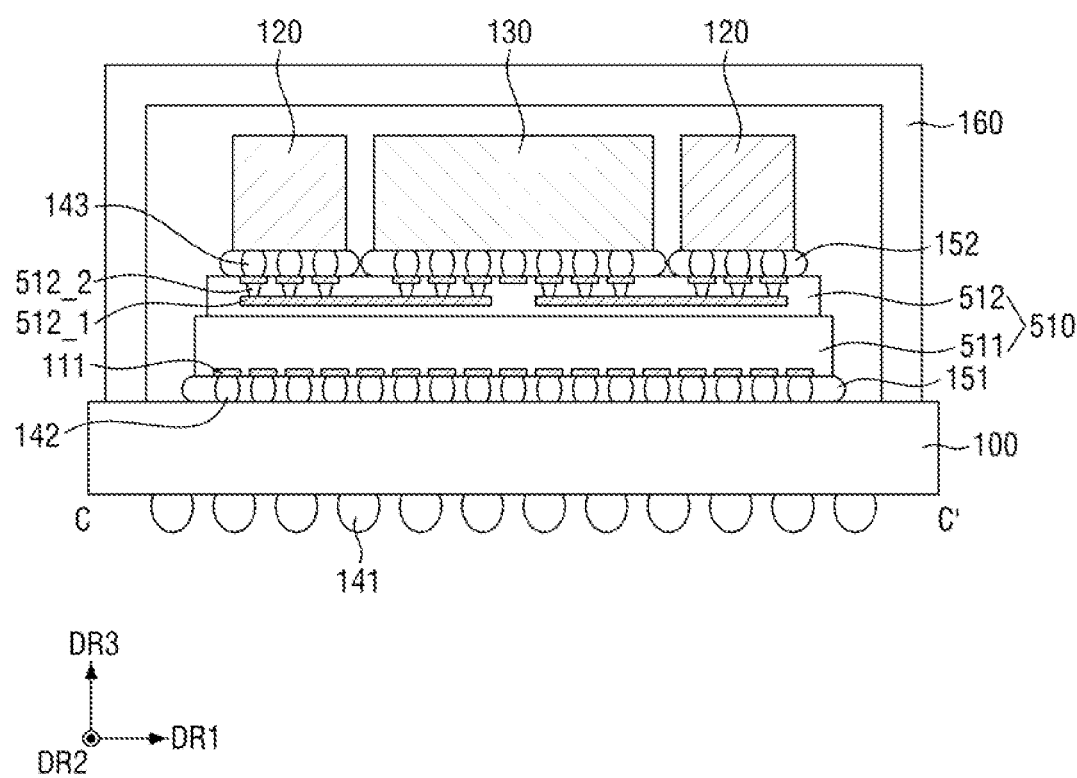
FIG. 17 is a cross-sectional view of a semiconductor package taken along line C-C' of FIG. 16 according to an exemplary embodiment of the present inventive concepts.

Referring to FIGS. 16 and 17, in the semiconductor package according to exemplary embodiments of the present inventive concepts, an interposer 510 may comprise a first interposer 511 disposed on an upper surface of the substrate 100, and a second interposer 512 disposed on the first interposer 511. For example as shown in the exemplary embodiment, a lower surface of the second interposer 512 may directly contact an upper surface of the first interposer 511. As shown in the exemplary embodiments of FIGS. 16-17, a width of the first interposer 511 (e.g., length in the first direction DR1) may be formed to be larger than a width length in the first direction DR1) of the second interposer 512. As shown in the exemplary embodiment of FIG. 16, the width of the first interposer 511 in the second direction DR2 may also be larger than the width of the second interposer 512 in the second direction DR2.

A plurality of wirings 512_1 and a plurality of vias 512_2 may be disposed inside the second interposer 512. The plurality of wirings 512_1 are spaced apart from each other, and may comprise wirings disposed at different levels. Each of the plurality of vias 512_2 may connect between the plurality of wirings 512_1 disposed at different levels.

The second semiconductor chip 120 and the third semiconductor chip 130 may be connected to the upper surface of the second interposer 512 by third solder balls 143 having an upper surface that contacts lower surfaces of the second semiconductor chip 120 and the third semiconductor chip 130 and having a lower surface that contacts an upper surface of the second interposer 512. The second semiconductor chip 120 may be electrically connected to the third semiconductor chip 130 through the second interposer 512.

Hereinafter, a semiconductor package according to exemplary embodiments of the present inventive concepts will be described with reference to FIGS. 18 and 19. Differences from the semiconductor package shown in FIGS. 1 to 4 will be mainly explained and a description of substantially identical elements will be omitted for convenience of explanation.

Figure 18:
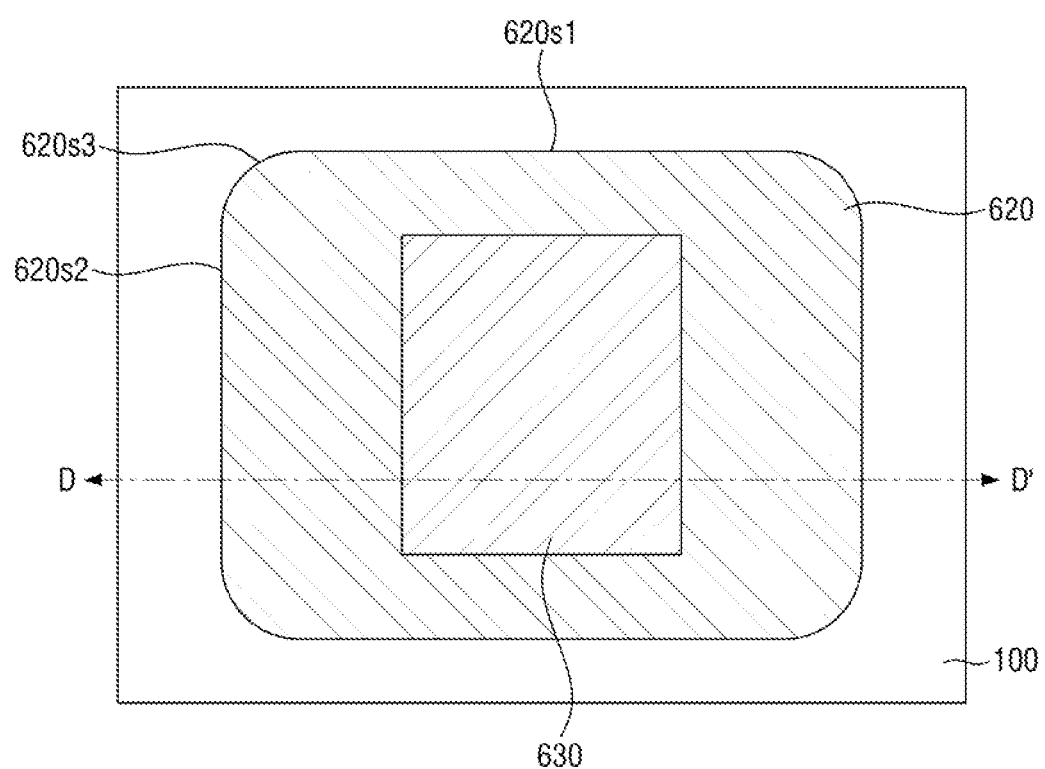
FIG. 18 is a plan view of a semiconductor package according to an exemplary embodiment of the present inventive concepts.
Figure 18:
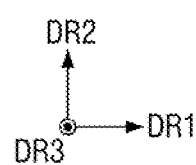

FIG. 18 is a plan view for explaining a semiconductor package according to an exemplary embodiment of the present inventive concepts. FIG. 19 is a cross-sectional view taken along a line D-D' of FIG. 13.

Figure 19:
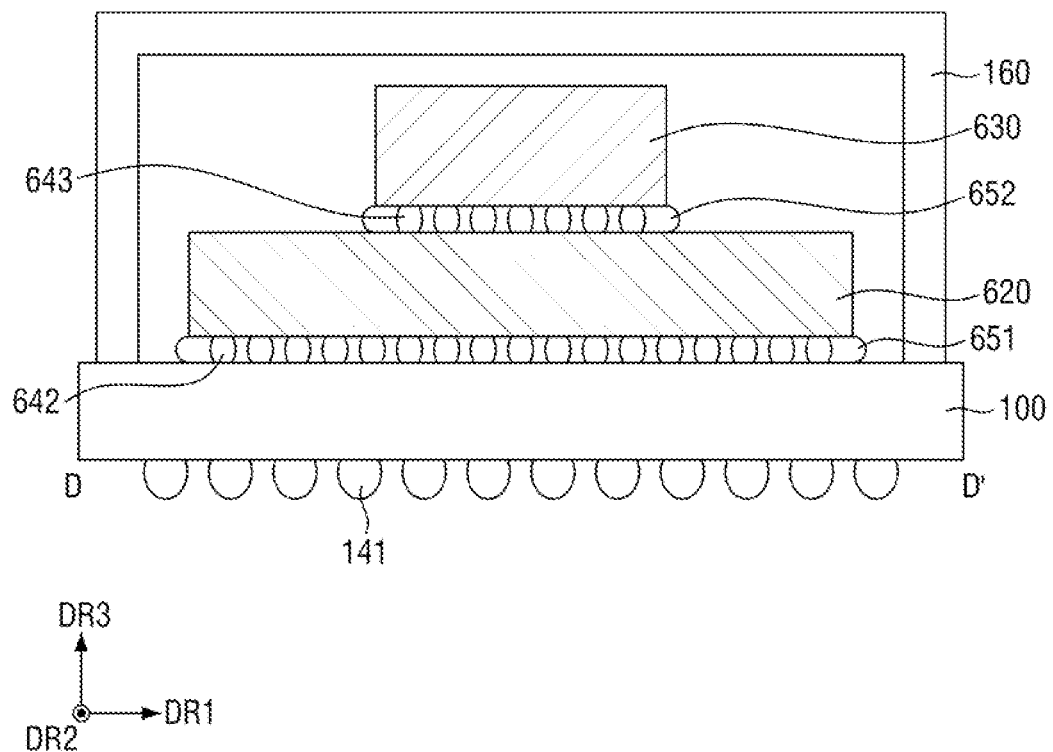
FIG. 19 is a cross-sectional view of a semiconductor package taken along line D-D' of FIG. 18 according to an exemplary embodiment of the present inventive concepts.

Referring to FIGS. 18 and 19, the semiconductor package according to exemplary embodiments of the present inventive concepts may comprise a first semiconductor chip 620 disposed on the upper surface of the substrate 100, and a second semiconductor chip 630 disposed on the upper surface of the first semiconductor chip 620.

The first semiconductor chip 620 may be electrically connected to the substrate 100 through the second solder ball 642. For example, as shown in the exemplary embodiment of FIG. 19, an upper surface of the second solder ball 642 may contact a lower surface of the first semiconductor chip 620 and a lower surface of the second solder ball 642 may contact an upper surface of the substrate 100. The second semiconductor chip 630 may be electrically connected to the first semiconductor chip 620 through the third solder ball 643. For example, as shown in the exemplary embodiment of FIG. 19, an upper surface of the third solder ball 643 may contact a lower surface of the second semiconductor chip 630 and a lower surface of the third solder ball 643 may contact an upper surface of the first semiconductor chip 620.

The first underfill material 651 may be disposed to wrap the lateral side surface of the second solder ball 642, between the upper surface of the substrate 100 and the lower surface of the first semiconductor chip 620. The second underfill material 652 may be disposed to wrap the side surface of the third solder ball 643, between the upper surface of the first semiconductor chip 620 and the lower surface of the second semiconductor chip 630. While the exemplary embodiment of FIG. 19 shows the first and second underfill materials 651, 652 protruding outwardly from lateral sides of the first semiconductor chip and second semiconductor chip 620, 630, respectively, exemplary embodiments of the present inventive concepts are not limited thereto.

The first semiconductor chip 620 has a first sidewall 620s1 extending in the first direction DR1, a second sidewall 620s2 extending in the second direction DR2, and a third sidewall 620s3 that connects the first sidewall 620s1 and the second sidewall 620s2. The third sidewall 620s3 of the first semiconductor chip 620 may have a curved surface shape.

Hereinafter, a semiconductor package according to exemplary embodiments of the present inventive concepts will be described with reference to FIGS. 20 and 21. Differences from the semiconductor package shown in FIGS. 18 and 19 will be mainly explained and a description of substantially identical elements will be omitted for convenience of explanation.

Figure 20:
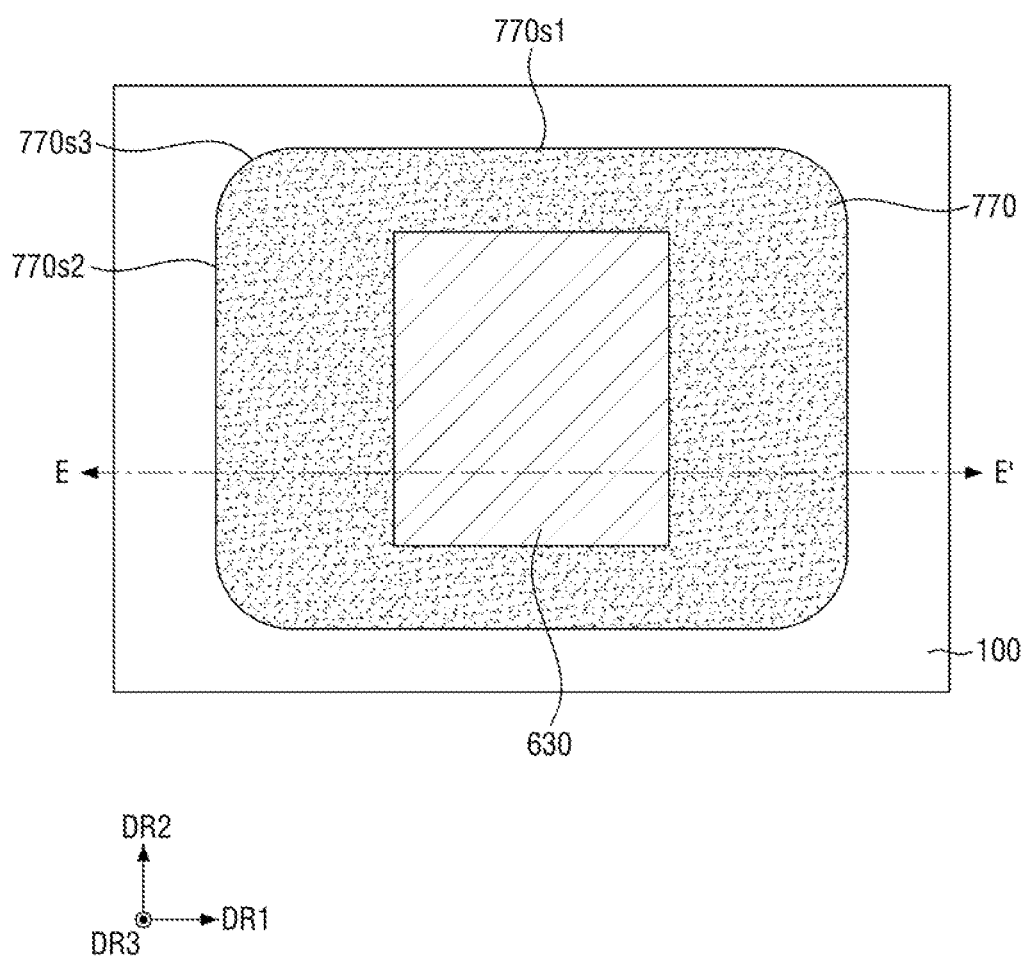
FIG. 20 is a plan view of a semiconductor package according to an exemplary embodiment of the present inventive concepts.

FIG. 20 is a plan view for explaining a semiconductor package according to an exemplary embodiment of the present inventive concepts. FIG. 21 is a cross-sectional view taken along a line E-E' of FIG. 20.

Figure 21:
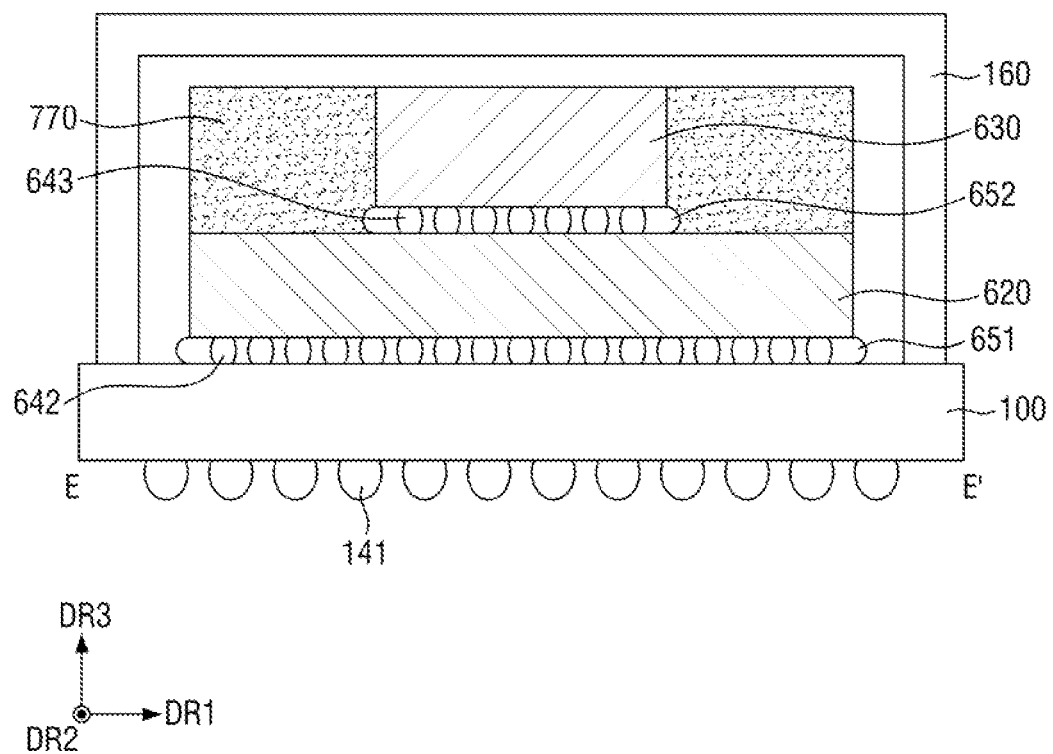
FIG. 21 is a cross-sectional view of a semiconductor package taken along line E-E' of FIG. 20 according to an exemplary embodiment of the present inventive concepts.

Referring to FIGS. 20 and 21, the semiconductor package according to exemplary embodiments of the present inventive concepts may comprise a first mold layer 770 disposed on the upper surface of the first semiconductor chip 620 to wrap the sidewall of the second semiconductor chip 630.

The first mold layer 770 may comprise a first sidewall 770s1 extending in the first direction DR1, a second sidewall 770s2 extending in the second direction DR2, and a third sidewall 770s3 that connects the first sidewall 770s1 and the second sidewall 770s2. The third sidewall 770s3 of the first mold layer 770 may have a curved surface shape.

In an exemplary embodiment, the first sidewall 770s1 of the first mold layer 770 may completely overlap the first sidewall (620s1 of FIG. 18) of the first semiconductor chip 620 in the third direction DR3. The second sidewall 770s2 of the first mold layer 770 may completely overlap the second sidewall 620s2 of the first semiconductor chip 620 in the third direction DR3. The third sidewall 770s3 of the first mold layer 770 may completely overlap the third sidewall 620s3 of the first semiconductor chip 620 in the third direction DR3.

As shown in the exemplary embodiment of FIG. 20, the first mold layer 770 may have a rectangular shape with curved corners and may include two first sidewalls 770s1 opposing each other in the second direction DR2, two second sidewalls 770s2 opposing each other in the first direction DR1 and four third sidewalls 770s3 which each connect adjacent ends of a first sidewall 770s1 and a second sidewall 770s2 to each other. However, exemplary embodiments of the present inventive concepts are not limited thereto and the first mold layer 770 may have numerous different shapes in which third sidewalls 770s3 having a curved shape each connects a first sidewall 770s1 and a second sidewall 770s2 which extend in a first direction DR1 and second direction DR2, respectively, which cross each other.

In an exemplary embodiment, the upper surface of the first mold layer 770 may be formed on the same plane as the upper surface of the second semiconductor chip 630. For example, the upper surfaces of the first mold layer 770 and the second semiconductor chip 630 may be formed in a plane defined in the first and second directions DR1, DR2. However, exemplary embodiments of the present inventive concepts are not limited thereto. In some other exemplary embodiments, the first mold layer 770 may be disposed to cover the upper surface of the second semiconductor chip 630 and may extend above the upper surface of the second semiconductor chip 630.

In an exemplary embodiment, the first mold layer 770 may include an epoxy molding compound (EMC) or two or more kinds of silicon hybrid substances. However, exemplary embodiments of the present inventive concepts are not limited thereto.

Hereinafter, a semiconductor package according to some exemplary embodiments of the present inventive concepts will be described with reference to FIGS. 22 and 23. Differences from the semiconductor package shown in FIGS. 1 to 4 will be mainly explained and a description of substantially identical elements will be omitted for convenience of explanation.

Figure 22:
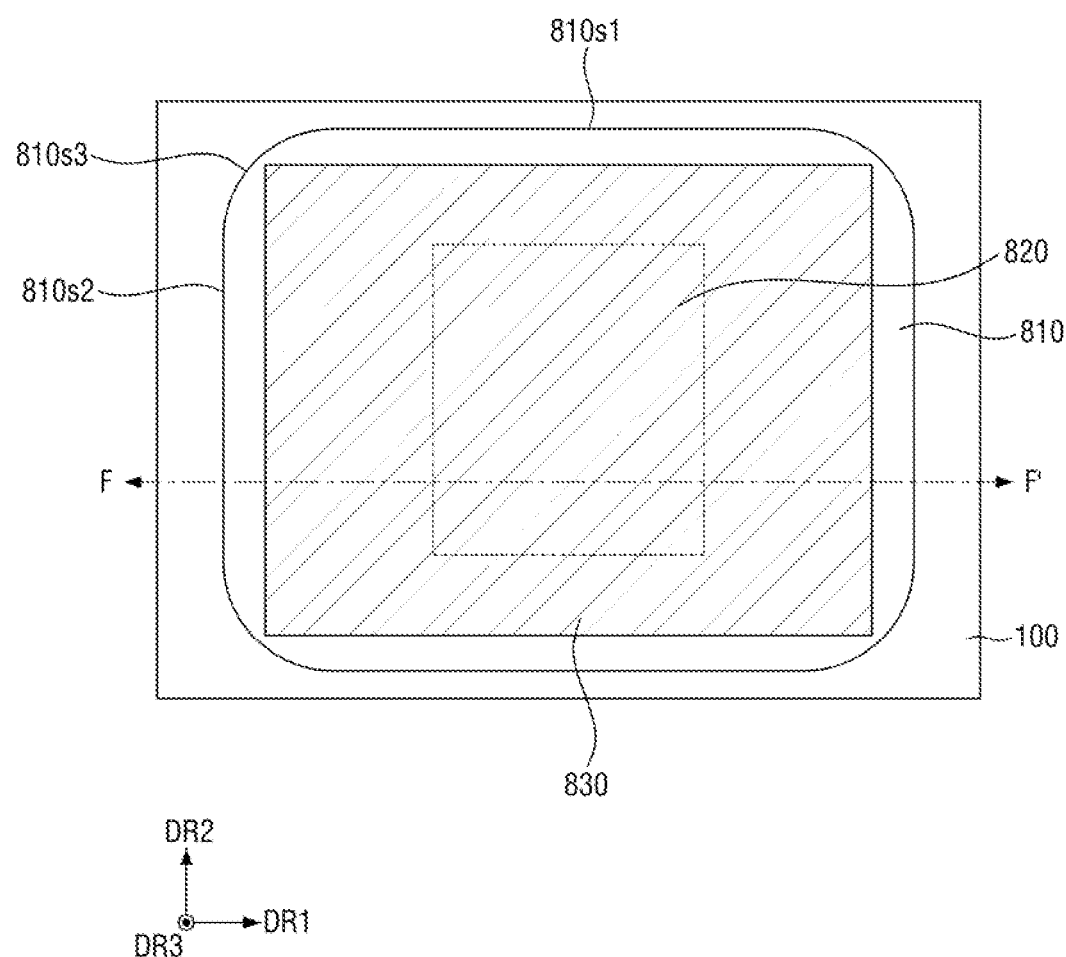
FIG. 22 is a plan view of a semiconductor package according to an exemplary embodiment of the present inventive concepts.

FIG. 22 is a plan view for explaining a semiconductor package according to an exemplary embodiment of the present inventive concepts. FIG. 23 is a cross-sectional view taken along a line F-F' of FIG. 22.

Figure 23:
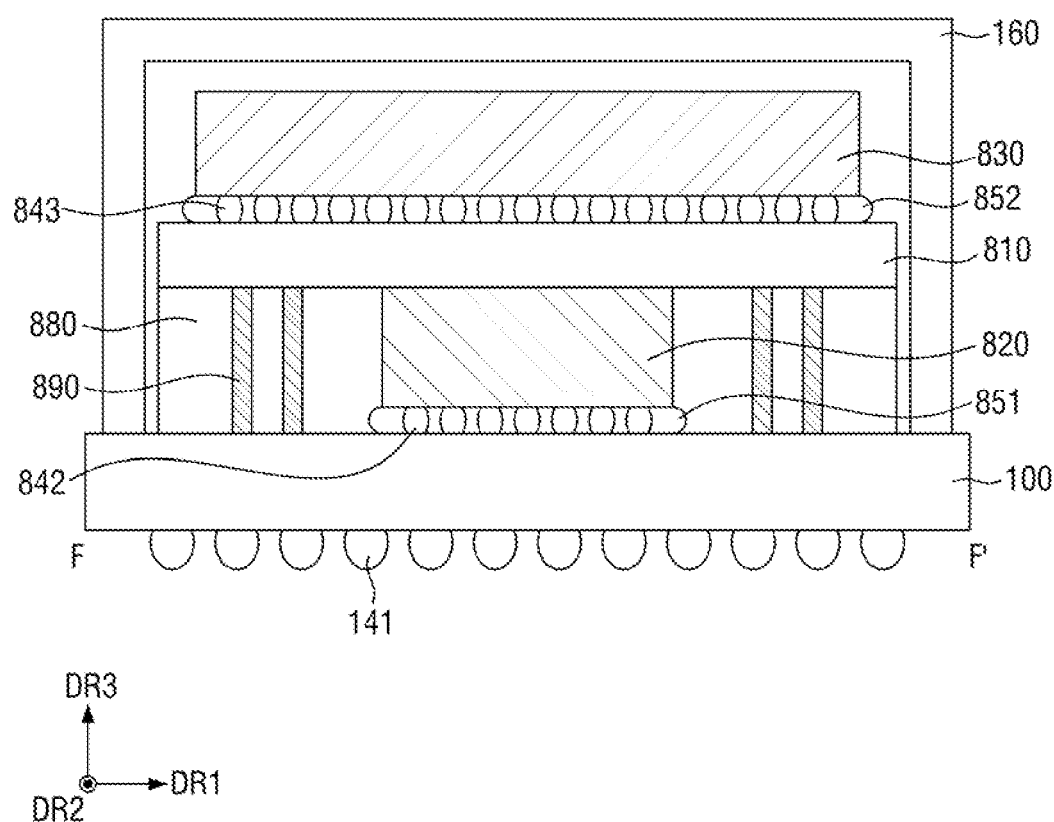
FIG. 23 is a cross-sectional view of a semiconductor package taken along a line F-F' of FIG. 22 according to an exemplary embodiment of the present inventive concepts.

Referring to FIGS. 22 and 23, the semiconductor package according to exemplary embodiments of the present inventive concepts may comprise a substrate 100, a first semiconductor chip 810, a second semiconductor chip 820, a third semiconductor chip 830, first to third solder balls 141, 842 and 843, first and second underfill materials 851 and 852, a heat sink 160, a second mold layer 880 and a penetration via 890.

The first semiconductor chip 810 may be disposed on the upper surface of the substrate 100. The first semiconductor chip 810 may be, for example, an interposer. Hereinafter, the first semiconductor chip 810 will be described as being an interposer for convenience of explanation.

The interposer 810 may comprise a first sidewall 810s1 extending in the first direction DR1, a second sidewall 810s2 extending in the second direction DR2, and a third sidewall 810s3 that connects the first sidewall 810s1 and the second sidewall 810s2. The third sidewall 810s3 of the interposer 810 may have a curved surface shape.

The interposer 810 may be electrically connected to the substrate 100 through a penetration via 890 extending in the third direction DR3.

The second semiconductor chip 820 may be disposed between the upper surface of the substrate 100 and the interposer 810 (e.g., in the third direction DR3). For example, as shown in the exemplary embodiment of FIG. 23, the lower surface of the first semiconductor chip 810 may directly contact an upper surface of the second semiconductor chip 820. The second semiconductor chip 820 may be electrically connected to the substrate 100 through the second solder ball 842. For example, an upper surface of the second solder ball 842 may directly contact a lower surface of the second semiconductor chip 820 and a lower surface of the second solder ball 842 may directly contact an upper surface of the substrate 100. The second semiconductor chip 820 may be electrically insulated from the interposer 810.

Although the exemplary embodiment of FIG. 23 shows that the upper surface of the second semiconductor chip 820 is in direct contact with the lower surface of the interposer 810, exemplary embodiments of the present inventive concepts are not limited thereto. In some other exemplary embodiments, the upper surface of the second semiconductor chip 820 may be spaced apart from the lower surface of the interposer 810 (e.g., in the third direction DR3).

A first underfill material 851 may be disposed to wrap the lateral side surface of the second solder ball 842, between the upper surface of the substrate 100 and the lower surface of the second semiconductor chip 820. While the exemplary embodiment of FIG. 23 shows the first underfill material 851 protruding from the lateral sides of the second semiconductor chip 820, exemplary embodiments of the present inventive concepts are not limited thereto.

The second mold layer 880 may be disposed between the upper surface of the substrate 100 and the lower surface of the interposer 810 (e.g., in the third direction DR3). The second mold layer 880 may be disposed to wrap the lateral side surface of the second semiconductor chip 820, the lateral side surface of the first underfill material 851, and the lateral side surfaces of the penetration via 890. In an exemplary embodiment, the second mold layer 880 may include an epoxy molding compound (EMC) or two or more kinds of silicon hybrid substances. However, exemplary embodiments of the present inventive concepts are not limited thereto.

The third semiconductor chip 830 may be disposed on the upper surface of the interposer 810. The third semiconductor chip 830 may be electrically connected to the interposer 810 through the third solder ball 843. For example, an upper surface of the third solder ball 843 may contact a lower surface of the third semiconductor chip 830 and a lower surface of the third solder ball 843 may contact an upper surface of the first semiconductor chip 810. The second underfill material 852 may be disposed to wrap the lateral side surface of the third solder ball 843, between the upper surface of the interposer 810 and the lower surface of the third semiconductor chip 830.

In concluding the detailed description, those skilled in the art will appreciate that many variations and modifications may be made to the disclosed exemplary embodiments without substantially departing from the principles of the present inventive concepts. Therefore, the disclosed exemplary embodiments of the present inventive concepts are used in a generic and descriptive sense only and not for purposes of limitation.

What is claimed is:

1. A semiconductor package comprising:
   a substrate;
   a first semiconductor chip disposed on the substrate and spaced apart from the substrate, the first semiconductor chip electrically connected to the substrate by solder balls, the first semiconductor chip comprising a first sidewall extending in a first direction, a second sidewall extending in a second direction that crosses the first direction, and a third sidewall disposed between the first sidewall and the second sidewall and configured to connect the first sidewall and the second sidewall, the third sidewall has a curved surface shape; and
   a second semiconductor chip disposed on the first semiconductor chip and electrically connected to the first semiconductor chip.

2. The semiconductor package of claim 1, wherein the first semiconductor chip is an interposer that includes silicon.

3. The semiconductor package of claim 1, further comprising:
   a third semiconductor chip disposed on the first semiconductor chip and spaced apart from the second semiconductor chip, wherein the first semiconductor chip is configured to electrically connect the third semiconductor chip to the second semiconductor chip.

4. The semiconductor package of claim 3, wherein:
the second semiconductor chip is a memory package comprising a plurality of memory semiconductor chips; and
the third semiconductor chip is a logic semiconductor chip.

5. The semiconductor package of claim 1, further comprising:
a mold layer disposed on the first semiconductor chip and surrounding at least one sidewall of the second semiconductor chip,
wherein the mold layer comprises a fourth sidewall extending in the first direction, a fifth sidewall extending in the second direction, and a sixth sidewall disposed between the fourth sidewall and the fifth sidewall and configured to connect the fourth sidewall and the fifth sidewall, the sixth sidewall has a curved surface shape.

6. The semiconductor package of claim 5, wherein the third sidewall of the first semiconductor chip completely overlaps the sixth sidewall of the mold layer in a third direction that is perpendicular to the first and second directions.

7. The semiconductor package of claim 5, wherein an upper surface of the second semiconductor chip and an upper surface of the mold layer are disposed on a same plane as each other.

8. The semiconductor package of claim 1; wherein the substrate comprises a seventh sidewall extending in the first direction, an eighth sidewall extending in the second direction, and a ninth sidewall disposed between the seventh sidewall and the eight sidewall and configured to connect the seventh sidewall and the eighth sidewall, the ninth sidewall has a curved surface shape.

9. The semiconductor package of claim 1, further comprising:
a heat sink disposed on the substrate to cover the first semiconductor chip and the second semiconductor chip.

10. The semiconductor package of claim 1, wherein a first width of the first semiconductor chip in the first direction is in a range of about 20 mm to about 80 mm, the first width including one first sidewall and two third sidewalk, and
a second width of each of the two third sidewalls included in the first width of the first semiconductor chip in the first direction is in a range of about 1 mm to about 10 mm.

11. The semiconductor package of claim 1, further comprising:
a fourth semiconductor chip disposed between the substrate and the first semiconductor chip and electrically connected to the substrate.

12. The semiconductor package of claim 1, wherein:
the first to third sidewalls are positioned inside sidewalls of the substrate; and
the third sidewall has a curved surface shape from a lowermost portion of the third sidewall directly contacting the solder balls to an uppermost portion of the third sidewall.

13. A semiconductor package comprising:
a substrate;
an interposer disposed on the substrate and spaced apart from the substrate, the interposer electrically connected to the substrate by solder balls, the interposer comprises a first sidewall extending in a first direction, a second sidewall extending in a second direction that crosses the first direction, and a third sidewall disposed between the first sidewall and the second sidewall and configured to connect the first sidewall and the second sidewall, the third sidewall has a curved surface shape;
a first semiconductor chip disposed on the interposer; and
a second semiconductor chip disposed on the interposer, the second semiconductor chip is spaced apart from the first semiconductor chip, wherein the interposer is configured to electrically connect the second semiconductor chip to the first semiconductor chip.

14. The semiconductor package of claim 13, further comprising:
a mold layer disposed on the interposer and surrounding at least one sidewall of the first semiconductor chip and at least one sidewall of the second semiconductor chip,
wherein the mold layer comprises a fourth sidewall extending in the first direction, a fifth sidewall extending in the second direction, and a sixth sidewall disposed between the fourth sidewall and the fifth sidewall and configured to connect the fourth sidewall and the fifth sidewall, the sixth sidewall has a curved surface shape.

15. The semiconductor package of claim 13, wherein the first semiconductor chip comprises a seventh sidewall extending in the first direction, an eighth sidewall extending in the second direction, and a ninth sidewall disposed between the seventh sidewall and the eighth sidewall and configured to connect the seventh sidewall and the eighth sidewall, the ninth sidewall has a curved surface shape.

16. The semiconductor package of claim 13, wherein:
the interposer comprises a first interposer disposed on the substrate, and a second interposer disposed on the first interposer,
wherein the second interposer is configured to electrically connect the first semiconductor chip to the second semiconductor chip.

17. The semiconductor package of claim 13, further comprising:
a heat sink disposed on the substrate and covering the interposer, the first semiconductor chip and the second semiconductor chip.

18. The semiconductor package of claim 13, wherein:
the first semiconductor chip is a memory package comprising a plurality of memory semiconductor chips; and
the second semiconductor chip is a logic; semiconductor chip.

19. The semiconductor package of claim 13, wherein the interposer includes silicon.

20. The semiconductor package of claim 13, wherein:
the first to third sidewalls are positioned inside sidewalls of the substrate; and
the third sidewall has a curved surface shape from a lowermost portion of the third sidewall directly contacting the solder balls to an uppermost portion of the third sidewall.

* * * * *